(12) United States Patent
Yamazaki et al.

(10) Patent No.: US 8,937,020 B2
(45) Date of Patent: Jan. 20, 2015

(54) SPUTTERING TARGET AND MANUFACTURING METHOD THEREOF, AND TRANSISTOR

(71) Applicant: Semiconductor Energy Laboratory Co., Ltd., Atsugi (JP)

(72) Inventors: Shunpei Yamazaki, Tokyo (JP); Toru Takayama, Kanagawa (JP); Keiji Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/922,323

(22) Filed: Jun. 20, 2013

(65) Prior Publication Data

US 2013/0277895 A1     Oct. 24, 2013

Related U.S. Application Data

(62) Division of application No. 12/945,421, filed on Nov. 12, 2010, now Pat. No. 8,492,862.

(30) Foreign Application Priority Data

Nov. 13, 2009  (JP) .................. 2009-260224

(51) Int. Cl.
*H01L 21/302* (2006.01)
*H01L 21/461* (2006.01)
(Continued)

(52) U.S. Cl.
CPC ..... *B29C 31/008* (2013.01); *C04B 2111/00844* (2013.01); *C04B 41/009* (2013.01);
(Continued)

(58) Field of Classification Search
USPC .................. 438/722, 240, 509, 512, 680; 257/E21.006, E21.077, E21.085, 257/E21.091, E21.126, E21.127, E21.212, 257/E21.304, E21.329, E21.347, E21.17, 257/E21.37

See application file for complete search history.

(56) References Cited

U.S. PATENT DOCUMENTS 5,661,050 A  8/1997 den et al.
5,731,856 A  3/1998 Kim et al.
(Continued)

FOREIGN PATENT DOCUMENTS

EP  0 837 502 A2  4/1998
EP  0 855 451 A1  7/1998
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — David Nhu
(74) *Attorney, Agent, or Firm* — Fish & Richardson P.C.

(57) ABSTRACT

One object is to provide a deposition technique for forming an oxide semiconductor film. By forming an oxide semiconductor film using a sputtering target including a sintered body of a metal oxide whose concentration of hydrogen contained is low, for example, lower than $1 \times 10^{16}$ atoms/cm$^3$, the oxide semiconductor film contains a small amount of impurities such as a compound containing hydrogen typified by $H_2O$ or a hydrogen atom. In addition, this oxide semiconductor film is used as an active layer of a transistor.

16 Claims, 16 Drawing Sheets

(51) Int. Cl.

| | |
|---|---|
| *C04B 41/00* | (2006.01) |
| *H01L 29/786* | (2006.01) |
| *C04B 35/453* | (2006.01) |
| *C23C 14/34* | (2006.01) |
| *H01L 21/02* | (2006.01) |
| *H01L 29/423* | (2006.01) |
| *C04B 35/01* | (2006.01) |
| *C23C 14/56* | (2006.01) |
| *C04B 35/645* | (2006.01) |
| *C23C 14/10* | (2006.01) |
| *B29C 31/00* | (2006.01) |
| *H01L 29/417* | (2006.01) |
| *H01L 29/66* | (2006.01) |
| *C04B 41/80* | (2006.01) |
| *H01L 29/45* | (2006.01) |
| *C04B 111/00* | (2006.01) |

(52) U.S. Cl.
CPC .......... H01L29/7869 (2013.01); C04B 35/453 (2013.01); C23C 14/3414 (2013.01); H01L 21/02422 (2013.01); H01L 21/02631 (2013.01); C04B 41/0072 (2013.01); C04B 2235/77 (2013.01); H01L 29/42384 (2013.01); C04B 2235/658 (2013.01); H01L 29/78618 (2013.01); C04B 2235/666 (2013.01); C04B 2235/3284 (2013.01); C04B 35/01 (2013.01); C23C 14/564 (2013.01); C04B 35/6455 (2013.01); C04B 2235/3286 (2013.01); H01L 21/02488 (2013.01); C04B 2235/3418 (2013.01); H01L 21/0242 (2013.01); C23C 14/10 (2013.01); C04B 2235/662 (2013.01); H01L 29/41733 (2013.01); C04B 35/645 (2013.01); H01L 21/02554 (2013.01); H01L 29/66742 (2013.01); C04B 41/80 (2013.01); H01L 21/02565 (2013.01); H01L 29/45 (2013.01)
USPC .... 438/722; 438/240; 438/680; 257/E21.006; 257/E21.007; 257/E21.085; 257/E21.091; 257/E21.126; 257/E21.127; 257/E21.212; 257/E21.304; 257/E21.329; 257/E21.347; 257/E21.17; 257/E21.37

(56) References Cited

U.S. PATENT DOCUMENTS

| | | | |
|---|---|---|---|
| 5,744,864 A | 4/1998 | Cillessen et al. | |
| 5,872,370 A | 2/1999 | Gu et al. | |
| 6,294,274 B1 | 9/2001 | Kawazoe et al. | |
| 6,329,275 B1 | 12/2001 | Ishigami et al. | |
| 6,563,174 B2 | 5/2003 | Kawasaki et al. | |
| 6,673,400 B1 | 1/2004 | Bedinger et al. | |
| 6,727,522 B1 | 4/2004 | Kawasaki et al. | |
| 6,958,260 B2 | 10/2005 | Bedinger et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,394 B2 | 8/2009 | Furuta et al. | |
| 7,580,276 B2 | 8/2009 | Sawa et al. | |
| 7,652,281 B2 | 1/2010 | Takahashi et al. | |
| 7,674,650 B2 | 3/2010 | Akimoto et al. | |
| 7,732,819 B2 | 6/2010 | Akimoto et al. | |
| RE41,975 E | 11/2010 | Ishigami et al. | |
| 7,872,722 B2 | 1/2011 | Kimura | |
| 7,897,067 B2 | 3/2011 | Inoue | |
| 8,492,862 B2 * | 7/2013 | Yamazaki et al. | 257/430 |
| 2001/0008157 A1 | 7/2001 | Bishop et al. | |
| 2001/0046027 A1 | 11/2001 | Tai et al. | |
| 2002/0056838 A1 | 5/2002 | Ogawa | |
| 2002/0126243 A1 | 9/2002 | Hibino et al. | |
| 2002/0132454 A1 | 9/2002 | Ohtsu et al. | |
| 2003/0189401 A1 | 10/2003 | Kido et al. | |
| 2003/0218166 A1 | 11/2003 | Tsutsui | |
| 2003/0218222 A1 | 11/2003 | Wager et al. | |
| 2004/0036168 A1 | 2/2004 | Bedinger et al. | |
| 2004/0038446 A1 | 2/2004 | Takeda et al. | |
| 2004/0127038 A1 | 7/2004 | Carcia et al. | |
| 2004/0195574 A1 | 10/2004 | Ahn et al. | |
| 2005/0017302 A1 | 1/2005 | Hoffman | |
| 2005/0122443 A1 | 6/2005 | Kim et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0079075 A1 | 4/2008 | Seon et al. | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |

(56) References Cited

U.S. PATENT DOCUMENTS

| | | |
|---|---|---|
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2008/0318394 A1 | 12/2008 | Kakehata et al. |
| 2009/0008639 A1 | 1/2009 | Akimoto et al. |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236596 A1 | 9/2009 | Itai |
| 2009/0239335 A1 | 9/2009 | Akimoto et al. |
| 2009/0269881 A1 | 10/2009 | Furata et al. |
| 2009/0278122 A1 | 11/2009 | Hosono et al. |
| 2009/0280600 A1 | 11/2009 | Hosono et al. |
| 2010/0007829 A1 | 1/2010 | Oikawa et al. |
| 2010/0013372 A1 | 1/2010 | Oikawa et al. |
| 2010/0065844 A1 | 3/2010 | Tokunaga |
| 2010/0090217 A1 | 4/2010 | Akimoto |
| 2010/0092800 A1 | 4/2010 | Itagaki et al. |
| 2010/0108502 A1 | 5/2010 | Inoue et al. |
| 2010/0109002 A1 | 5/2010 | Itagaki et al. |
| 2010/0136743 A1 | 6/2010 | Akimoto et al. |
| 2010/0283049 A1 | 11/2010 | Sato et al. |
| 2010/0301328 A1 | 12/2010 | Yamazaki et al. |
| 2011/0079777 A1 | 4/2011 | Akimoto |
| 2011/0092017 A1 | 4/2011 | Akimoto et al. |
| 2011/0114999 A1 | 5/2011 | Yamazaki et al. |

FOREIGN PATENT DOCUMENTS

| | | |
|---|---|---|
| EP | 1 553 205 A1 | 7/2005 |
| EP | 1 737 044 A1 | 12/2006 |
| EP | 1 770 788 A2 | 4/2007 |
| EP | 1 995 787 A2 | 11/2008 |
| EP | 1 998 373 A2 | 12/2008 |
| EP | 1 998 374 A2 | 12/2008 |
| EP | 1 998 375 A2 | 12/2008 |
| EP | 2 096 188 A1 | 9/2009 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-044465 A | 2/1991 |
| JP | 04-154654 A | 5/1992 |
| JP | 04-293769 A | 10/1992 |
| JP | 04-317455 A | 11/1992 |
| JP | 05-251705 A | 9/1993 |
| JP | 07-003443 A | 1/1995 |
| JP | 07-258836 A | 10/1995 |
| JP | 08-264794 A | 10/1996 |
| JP | 09-071860 A | 3/1997 |
| JP | 10-219480 A | 8/1998 |
| JP | 11-050244 A | 2/1999 |
| JP | 11-505377 A | 5/1999 |
| JP | 11-279755 A | 10/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-213407 A | 7/2003 |
| JP | 2003-277924 A | 10/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-091789 A | 4/2008 |
| JP | 2008-144246 A | 6/2008 |
| JP | 2009-021612 A | 1/2009 |
| JP | 2009-076874 A | 4/2009 |
| WO | WO 97/13885 A1 | 4/1997 |
| WO | WO 03/062488 A1 | 7/2003 |
| WO | WO 2004/114391 A1 | 12/2004 |
| WO | WO 2007/108293 A1 | 9/2007 |
| WO | WO 2008/072486 A1 | 6/2008 |
| WO | WO 2009/072532 A1 | 6/2009 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

(56) References Cited

OTHER PUBLICATIONS

Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties, SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems,", Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED ,", IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structures," NIRIM Newsletter, Mar. 1995, vol. 150, pp. 1-4 with English translation.
Nakamura, M et al., "The phase relations in the In2O3-Ga2ZnO4-ZnO system at 1350° C," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.
Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.
Ohara, H et al., "Amorphous In—Ga—Zn—Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.
Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water,"Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/069121, dated Nov. 22, 2010, 3 pages.

Written Opinion, PCT Application No. PCT/JP2010/069121, dated Nov. 22, 2010, 8 pages.

Nakamura et al.; "Syntheses and crystal structures of new homologous compounds, indium iron zinc oxides (InFeO3 (ZnO)m) (m natural number) and related compounds"; Kotai Butsuri (Solid State Physics); 1993; pp. 317-327; vol. 28, No. 5.

Ishikawa.M, "Secondary Ion Mass Spectrometry(SIMS)", Center News, Jan. 31, 2009, vol. 28, No. 1, pp. 1-6, Center of Advanced Instrumental Analysis, Kyusyu University.

* cited by examiner

FIG. 1A  weigh and mix target materials

FIG. 1B  baking the mixture

FIG. 1C  forming a target having desired shape or the like

FIG. 1D  cleaning the target

FIG. 1E  performing heat treatment

FIG. 1F  attaching the target to a backing plate

SPUTTERING TARGET AND MANUFACTURING METHOD THEREOF, AND TRANSISTOR

CROSS-REFERENCE TO RELATED APPLICATIONS

This application is a divisional of U.S. application Ser. No. 12/945,421, filed Nov. 12, 2010, now U.S. Pat. No. 8,492,862, which claims the benefit of a foreign priority application filed in Japan as Serial No. 2009-260224 on Nov. 13, 2009, both of which are incorporated by reference.

TECHNICAL FIELD

The present invention relates to a sputtering target and a manufacturing method thereof. In addition, the present invention relates to a transistor manufactured using the sputtering target.

BACKGROUND ART

A transistor formed over a flat plate such as a glass substrate, which is typically used in a liquid crystal display device, is generally formed using a semiconductor material such as amorphous silicon or polycrystalline silicon. A transistor manufactured using amorphous silicon has low field effect mobility, but can be formed over a larger glass substrate. In contrast, a transistor manufactured using polycrystalline silicon has high field effect mobility, but needs a crystallization step such as laser annealing and is not always suitable for a larger glass substrate.

Thus, a technique in which a transistor is manufactured using an oxide semiconductor as a semiconductor material and applied to an electronic device or an optical device has attracted attention. For example, Patent Document 1 and Patent Document 2 disclose a technique by which a transistor is formed using zinc oxide or an In—Ga—Zn—O-based oxide semiconductor as a semiconductor material and such a transistor is used as a switching element or the like of an image display device.

A transistor in which a channel formation region (also referred to as a channel region) is provided in an oxide semiconductor can have higher field effect mobility than a transistor using amorphous silicon. An oxide semiconductor film can be formed by a sputtering method or the like at a relatively low temperature. Its manufacturing process is easier than that of a transistor using polycrystalline silicon.

Transistors which are formed using such an oxide semiconductor over a glass substrate, a plastic substrate, or the like are expected to be applied to display devices such as a liquid crystal display, an electroluminescent display (also referred to as an EL display), and electronic paper.

REFERENCE

[Patent Document 1] Japanese Published Patent Application No. 2007-123861
[Patent Document 2] Japanese Published Patent Application No. 2007-96055

DISCLOSURE OF INVENTION

However, characteristics of a semiconductor element which is manufactured using an oxide semiconductor are not yet sufficient. For example, a controlled threshold voltage, high operation speed, a relatively easy manufacturing process, and sufficient reliability are required for a transistor including an oxide semiconductor film.

An object of one embodiment of the present invention is to provide a deposition technique for forming an oxide semiconductor film. In addition, an object of one embodiment of the present invention is to provide a method for manufacturing a highly reliable semiconductor element including the oxide semiconductor film.

The density of carriers in an oxide semiconductor film has influence on the threshold voltage of a transistor including the oxide semiconductor. The carriers in the oxide semiconductor film are generated due to impurities contained in the oxide semiconductor film. For example, impurities such as a compound containing a hydrogen atom typified by $H_2O$, a compound containing a carbon atom, a hydrogen atom, or a carbon atom contained in the deposited oxide semiconductor film increase the carrier density of the oxide semiconductor film.

In a transistor manufactured using an oxide semiconductor film containing impurities such as a compound containing a hydrogen atom typified by $H_2O$ or a hydrogen atom, it is difficult to control degradation over time such as a shift in the threshold voltage.

In order to achieve the above objects, impurities contained in the oxide semiconductor film which have influence on the carrier density, for example, impurities such as a compound containing a hydrogen atom typified by $H_2O$ or a hydrogen atom may be removed. Specifically, an oxide semiconductor film containing a small amount of impurities is formed by removing impurities from a sputtering target used for deposition.

A sputtering target of one embodiment of the present invention is a sputtering target for forming an oxide semiconductor film and includes a sintered body of at least one metal oxide selected from magnesium oxide, zinc oxide, aluminum oxide, gallium oxide, indium oxide, and tin oxide. The concentration of hydrogen contained in the sintered body is lower than $1 \times 10^{16}$ atoms/cm$^3$.

A sputtering target of one embodiment of the present invention is a sputtering target for forming an oxide semiconductor film and includes a sintered body of indium oxide, gallium oxide, and tin oxide. The concentration of hydrogen contained in the sintered body is lower than $1 \times 10^{16}$ atoms/cm$^3$.

Further, in the above sputtering target, silicon oxide may be contained at 0.1 wt % to 20 wt % inclusive.

A transistor of one embodiment of the present invention includes, as an active layer, an oxide semiconductor layer which is formed using the above sputtering target.

In a manufacturing method of a sputtering target of one embodiment of the present invention, a plurality of metal oxides are mixed and baked to form a sintered body of the metal oxides, mechanical processing is performed on the sintered body of the metal oxides so that a target having a desired shape is formed, the target is cleaned, and heat treatment is performed on the cleaned target.

In a manufacturing method of a sputtering target of one embodiment of the present invention, a plurality of metal oxides are mixed and baked to form a sintered body of the metal oxides, mechanical processing is performed on the sintered body of the metal oxides so that a target having a desired shape is formed, the target is cleaned, heat treatment is performed on the cleaned target, and the target and a backing plate are attached to each other.

Note that the ordinal numbers such as "first" and "second" in this specification are used for convenience and do not denote the order of steps and the stacking order of layers. In addition, the ordinal numbers in this specification do not denote particular names which specify the present invention.

In this specification, oxynitride refers to a substance that contains more oxygen atoms than nitrogen atoms and nitride oxide refers to a substance that contains more nitrogen atoms than oxygen atoms. For example, a silicon oxynitride film means a film that contains more oxygen atoms than nitrogen atoms, and contains oxygen, nitrogen, silicon, and hydrogen at concentrations ranging from 50 atomic % to 70 atomic % inclusive, 0.5 atomic % to 15 atomic % inclusive, 25 atomic % to 35 atomic % inclusive, and 0.1 atomic % to 10 atomic % inclusive, respectively, when they are measured by RBS (Rutherford backscattering spectrometry) and HFS (hydrogen forward scattering). Further, a silicon nitride oxide film means a film that contains more nitrogen atoms than oxygen atoms, and contains oxygen, nitrogen, silicon, and hydrogen at concentrations ranging from 5 atomic % to 30 atomic % inclusive, 20 atomic % to 55 atomic % inclusive, 25 atomic % to 35 atomic % inclusive, and 10 atomic % to 30 atomic % inclusive, respectively, when they are measured by RBS and HFS. Note that percentages of nitrogen, oxygen, silicon, and hydrogen fall within the ranges given above, where the total number of atoms contained in the silicon oxynitride film or the silicon nitride oxide film is defined as 100 atomic %.

In this specification and the like, the terms "over" and "below" do not necessarily mean "directly on" and "directly below", respectively, in the description of a physical relationship between components. For example, the expression of "a first gate electrode over a gate insulating layer" does not exclude the case where another component is interposed between the gate insulating layer and the gate electrode. In addition, the terms "over" and "below" are used only for convenience of the description. Unless otherwise specified, the case where the positions thereof are interchanged is included.

In this specification and the like, the term "electrode" or "wiring" does not limit the function of components. For example, an "electrode" can be used as part of a "wiring", and the "wiring" can be used as part of the "electrode". In addition, the term "electrode" or "wiring" can also mean a combination of a plurality of "electrodes" and "wirings", for example.

Further, functions of a "source" and a "drain" might be switched when transistors having different polarities are employed or a direction of current flow is changed in circuit operation, for example. Therefore, the terms "source" and "drain" can be switched in this specification.

Note that in this specification, a measurement value by secondary ion mass spectrometry (SIMS) is used as the hydrogen concentration in the target or the oxide semiconductor film. It is known that it is difficult to obtain accurate data in the proximity of a surface of a sample or in the proximity of an interface between stacked films formed using different materials by the SIMS analysis in principle. Thus, in the case where distributions of the hydrogen concentrations in the films in thickness directions are analyzed by SIMS, an average value in a region where the films are provided, the value is not greatly changed, and almost constant level of strength can be obtained is employed as the hydrogen concentration. Further, in the case where the thickness of the film is small, a region where almost constant level of strength can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

In one embodiment of the present invention, a sputtering target containing a small amount of impurities such as a compound containing a hydrogen atom typified by $H_2O$ or a hydrogen atom can be provided. An oxide semiconductor film in which impurities are reduced can be formed using the sputtering target. A manufacturing method of a highly reliable semiconductor element including the oxide semiconductor film containing a small amount of impurities can be provided.

BRIEF DESCRIPTION OF DRAWINGS

FIGS. 1A to 1F are a flow chart illustrating a manufacturing method of a sputtering target.

BEST MODE FOR CARRYING OUT THE INVENTION

Figure 2A:
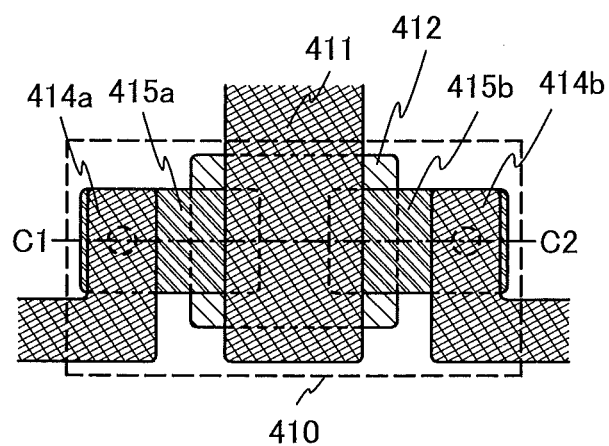
FIGS. 2A and 2B are a plan view and a cross-sectional view illustrating a transistor according to an embodiment, respectively.

Embodiments of the present invention will be described in detail below with reference to drawings. Note that the present invention is not limited to the following description and it will be easily understood by those skilled in the art that modes and details can be modified in various ways. Therefore, the present invention is not construed as being limited to description of the embodiments. Note that in the drawings of this specification, the identical portions or portions having a similar function are denoted by the identical reference numerals, and description thereon may be omitted.

Embodiment 1

In this embodiment, a manufacturing method of a sputtering target (hereinafter, also referred to as a target) which is one embodiment of the present invention will be described with reference to FIGS. 1A to 1F. FIGS. 1A to 1F are a flow chart illustrating an example of a manufacturing method of a sputtering target according to this embodiment.

First, target materials are weighed as appropriate, and the weighed target materials are mixed, while each being crushed by a ball mill or the like. As target materials for forming an oxide semiconductor film, for example, magnesium oxide, zinc oxide, aluminum oxide, gallium oxide, indium oxide, tin oxide, and the like may be mixed as appropriate (FIG. 1A).

Further, silicon oxide may be added to the target at 2 wt % to 10 wt % inclusive, so that $SiO_X$ (X>0) is included in the oxide semiconductor film. When an oxide semiconductor film includes $SiO_X$ (X>0), crystallization of the oxide semiconductor film can be inhibited.

In this embodiment, an In—Ga—Zn—O-based oxide semiconductor target for film formation is to be manufactured. For example, $In_2O_3$, $Ga_2O_3$, and ZnO are weighed so that the composition ratio of $In_2O_3$:$Ga_2O_3$:ZnO is 1:1:1 [molar ratio].

As examples of the oxide semiconductor target for film formation which is manufactured in this embodiment, without being limited to an In—Ga—Zn—O-based oxide semiconductor target for film formation, oxide semiconductor targets for film formation which are In—Sn—Ga—Zn—O-based, In—Sn—Zn—O-based, In—Al—Zn—O-based, Sn—Ga—Zn—O-based, Al—Ga—Zn—O-based, Sn—Al—Zn—O-based, In—Zn—O-based, Sn—Zn—O-based, Al—Zn—O-based, Zn—Mg—O-based, Sn—Mg—O-based, In—Mg—O-based, In—O-based, Sn—O-based, Zn—O-based, and the like are given.

Next, the mixture is shaped into a predetermined shape and baked, whereby a sintered body of the metal oxide is obtained (FIG. 1B). By baking the target material, hydrogen, moisture, hydrocarbon, and the like can be prevented from being mixed into the target. The baking can be performed in an inert gas atmosphere (a nitrogen atmosphere or a rare gas atmosphere), in vacuum, or in a high-pressure atmosphere, and further, may be performed with application of mechanical pressure. As a baking method, an atmospheric sintering method, a pressure sintering method, or the like can be used as appropriate. As the pressure sintering method, a hot pressing method, a hot isostatic pressing (HIP) method, a discharge plasma sintering method, or an impact method is preferably used. Although the maximum temperature at which baking is performed is selected depending on the sintering temperature of the target material, it is preferably set at approximately 1000° C. to 2000° C., or more preferably, 1200° C. to 1500° C. Although the holding time of the maximum temperature is selected depending on the target material, 0.5 hours to 3 hours is preferable.

Note that the filling rate of the oxide semiconductor target for film formation in this embodiment is preferably 90% to 100% inclusive, or more preferably, 95% to 99.9% inclusive. By using an oxide semiconductor target for film formation with a high filling rate, a cavity formed in the target, which adsorbs impurities such as moisture at the time of sputtering deposition, can be removed. In addition, generation of nodules is prevented at the time of sputtering deposition, whereby uniform discharge is possible and generation of particles can be suppressed. Further, the deposited oxide semiconductor film has a surface with excellent smoothness and is a dense film. As a result, the impurity concentration is suppressed, whereby an oxide semiconductor film with a uniform quality can be obtained.

Next, mechanical processing is performed in order to form a target having desired dimensions, shape and surface roughness (FIG. 1C). As a processing means, for example, mechanical polishing, chemical mechanical polishing (CMP), or a combination of these can be used.

After that, in order to remove minute dusts and components of a grinding solution generated by the mechanical processing, the target is cleaned by ultrasonic cleaning in which the target is soaked in water or an organic solvent, cleaning with running water, or the like (FIG. 1D). By performing cleaning after the mechanical processing, a target from which dusts and impurities are removed can be obtained, and a high-purity film with high quality can be formed using the target.

Then, heat treatment is performed on the target which has been cleaned (FIG. 1E). The heat treatment is preferably performed in an inert gas atmosphere (a nitrogen atmosphere or a rare gas atmosphere). Although the temperature of the heat treatment differs depending on the target material, it is set at a temperature at which the target is not changed in property and hydrogen and moisture on the surface of the target are sufficiently eliminated. Specifically, the temperature is 150° C. to 750° C. inclusive, preferably, 425° C. to 750° C. inclusive. Heating time is a time in which the concentration of hydrogen contained inside and on the surface of the target can be sufficiently reduced. Specifically, heating is performed for 0.5 hours or longer, preferably, for an hour or longer. By performing the heat treatment after cleaning, hydrogen, moisture, and the like which are mixed into the target by the cleaning can be eliminated from the target. The heat treatment may be performed in vacuum or in a high-pressure atmosphere.

As the heat treatment, for example, the target is introduced into an electric furnace which is one of heat treatment apparatuses, and heat treatment is performed in a nitrogen atmosphere. Then, the target is not exposed to air so that entry of moisture and hydrogen is prevented and a target in which the concentration of hydrogen is reduced is obtained. The same furnace is used from heating temperature T to a temperature which is enough to prevent entry of moisture. Specifically, the substrate is cooled slowly until temperature becomes less than heating temperature T by 100° C. or more. Without limitation to a nitrogen atmosphere, the heat treatment is performed in a helium atmosphere, a neon atmosphere, an argon atmosphere, or the like.

Note that the heat treatment apparatus is not limited to the electric furnace and may be, for example, a rapid thermal annealing (RTA) apparatus such as a gas rapid thermal annealing (GRTA) apparatus or a lamp rapid thermal annealing (LRTA) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed by thermal radiation using light emitted from the above-described lamp and by conduction of heat from a gas heated by light emitted from a lamp. As the gas, an inert gas which does not react with an object to be processed by heat treatment, such as nitrogen or a rare gas such as argon is used. In addition, the LRTA apparatus and the GRTA apparatus may be provided with a device that heats the product by heat conduction or heat radiation from not only a lamp but also a heater such as a resistance heater.

In the heat treatment, it is preferable that moisture, hydrogen, and the like be not contained in nitrogen or a rare gas such as helium, neon, or argon. It is preferable that the purity of nitrogen or the rare gas such as helium, neon, or argon which is introduced into a heat treatment apparatus be set to be 6 N (99.9999%) or higher, preferably 7 N (99.99999%) or higher (that is, the impurity concentration is 1 ppm or lower, preferably 0.1 ppm or lower).

A general oxide semiconductor target for film formation contains hydrogen at $1 \times 10^{20}$ to $1 \times 10^{21}$ atoms/cm$^3$, which is measured using secondary ion mass spectrometry (SIMS). However, the target described in this embodiment can contain hydrogen at, for example, $5 \times 10^{19}$ atoms/cm$^3$ or less, preferably, $5 \times 10^{18}$ atoms/cm$^3$ or less, more preferably, $5 \times 10^{17}$ atoms/cm$^3$ or less or less than $1 \times 10^{16}$ atoms/cm$^3$, by the heat treatment after the cleaning. Thus, the concentration of hydrogen contained in the oxide semiconductor film which is formed using the target can be reduced.

After that, the target is attached to a metal plate called a backing plate (FIG. 1F). A backing plate has functions of cooling a target material and being a sputtering electrode and thus is preferably formed using copper, which is excellent in thermal conductivity and electric conductivity. Alternatively, titanium, a copper alloy, a stainless steel alloy, or the like can be used other than copper. A cooling path is formed inside or on the back surface of the backing plate, and water, oil, or the like circulates through the cooling path as a coolant; thus, cooling efficiency of a target at the time of sputtering deposition can be increased. Note that water vaporizes at 100° C.; therefore, in the case where the temperature of the target needs to be kept at 100° C. or higher, oil or the like is preferable to water.

The target and the backing plate can be attached to each other, for example, by electron beam welding. The electron beam welding refers to a method in which electrons generated in a vacuum atmosphere are accelerated, focused, and then delivered to an object, whereby welding can be performed only on a portion which is desired to be welded without damage on the material property of portions of the object except for the welded portion. In the electron beam welding, the shape of the welded portion and the depth of welding can be controlled. Since the welding is performed in vacuum, hydrogen, moisture, hydrocarbon, or the like can be prevented from attaching to the target.

As a brazing material for attaching the target to the backing plate, Au, Bi, Sn, Zn, In, an alloy of these materials, or the like is preferably used. Note that a metal (or alloy) material with high conductivity is preferably used as a brazing material. Further, a back coat layer may be formed between the brazing material and the target. By forming a back coat layer, adhesion between the target and the backing plate can be improved.

In this embodiment, an example in which heat treatment after cleaning is performed before the attachment of the target to the backing plate is described; however, the embodiments of the present invention are not limited thereto, and heat treatment may be performed after the attachment of the target and the backing plate or may be performed plural times before and after the attachment. Note that it is preferable that heat treatment after the attachment of the target and the backing plate be performed at 150° C. to 350° C. inclusive, in consideration of the heat resistance of the brazing material or the backing plate. Heat treatment is preferably performed in an inert gas atmosphere (a nitrogen atmosphere or a rare gas atmosphere).

It is preferable that the target which has been subjected to the heat treatment be transferred, stored, and the like in a high-purity oxygen gas atmosphere, a high-purity N$_2$O gas atmosphere, or an ultra dry air (having a dew point of −40° C. or lower, preferably −60° C. or lower) atmosphere, in order to prevent entry of moisture or hydrogen. The target may be covered with a protective material formed of a material with low water permeability such as a stainless steel alloy, and the above gas may be introduced into a gap between the protective material and the target. It is preferable that the oxygen gas and the N$_2$O gas do not include moisture, hydrogen, and the like. Alternatively, the purity of an oxygen gas or an N$_2$O gas is preferably 6 N (99.9999%) or higher, more preferably 7 N (99.99999%) or higher (that is, the impurity concentration of the oxygen gas or the N$_2$O gas is 1 ppm or lower, preferably 0.1 ppm or lower).

Through the above steps, the sputtering target described in this embodiment can be manufactured. The sputtering target in this embodiment can eliminate impurities such as a hydrogen atom or a compound containing a hydrogen atom, which results in a reduction in the amount of impurities, by being subjected to heat treatment after cleaning in the manufacturing process. Therefore, the concentration of impurities contained in the oxide semiconductor film which is formed using the target can also be reduced. Impurities such as a hydrogen atom may be eliminated by irradiation using a UV lamp in vacuum instead of heat treatment, or irradiation using a UV lamp and heat treatment may be used in combination.

Similarly, the target is set in a sputtering apparatus in an inert gas atmosphere (a nitrogen atmosphere or a rare gas atmosphere) without being exposed to air. Accordingly, hydrogen, moisture, hydrocarbon, or the like can be prevented from attaching to the target.

In addition, after the target is set in the sputtering apparatus, dehydrogenation treatment is preferably performed to remove hydrogen which remains on a surface of or inside the target material. As the dehydrogenation treatment, a method in which the inside of the film formation chamber is heated to 200° C. to 600° C. under reduced pressure, a method in which introduction and removal of nitrogen or an inert gas are repeated while the inside of the film formation chamber is heated, and the like can be given. In this case, not water but oil or the like is preferably used as a coolant for the target. Although a certain level of effect can be obtained when introduction and removal of nitrogen are repeated without heating, it is preferable to perform the treatment with the inside of the film formation chamber heated. Alternatively, oxygen, an inert gas, or both oxygen and an inert gas may be introduced into the film formation chamber, and plasma of an inert gas and/or oxygen may be generated using a high frequency wave or a microwave. Although a certain level of effect can be obtained when the treatment is performed without heating, it is preferable to perform the treatment with the inside of the film formation chamber heated.

Note that this embodiment can be combined with any of the other embodiments, as appropriate.

Embodiment 2

In this embodiment, an example of manufacturing a transistor as a semiconductor device which is manufactured using the target in Embodiment 1 will be described. In a transistor 410 described in this embodiment, an oxide semiconductor film which is formed using the sputtering target described in Embodiment 1 can be used as an active layer.

One embodiment of a transistor and one embodiment of a manufacturing method of the transistor of this embodiment are described with reference to FIGS. 2A and 2B and FIGS. 3A to 3E.

Figure 2B:
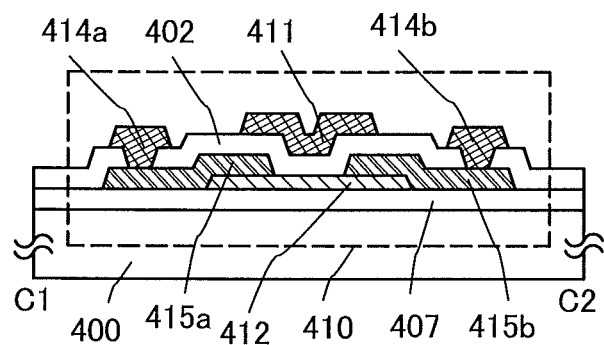

An example of a plan structure and an example of a cross-sectional structure of a transistor are respectively illustrated in FIGS. 2A and 2B. The transistor 410 illustrated in FIGS. 2A and 2B is one of top-gate transistors.

FIG. 2A is a plan view of the top-gate transistor 410 and FIG. 2B is a cross-sectional view taken along line C1-C2 in FIG. 2A.

The transistor 410 includes an oxide semiconductor layer 412, a source or drain electrode layer 415a, a source or drain electrode layer 415b, a gate insulating layer 402, and a gate electrode layer 411 over a substrate 400 and an insulating layer 407. A wiring layer 414a and a wiring layer 414b are respectively provided in contact with and electrically connect to the source or drain electrode layer 415a and the source or drain electrode layer 415b.

Although description is given using a single-gate transistor as the transistor 410, a multi-gate transistor including a plurality of channel formation regions may be formed as needed.

A process of manufacturing the transistor 410 over the substrate 400 is described below with reference to FIGS. 3A to 3E.

Although there is no particular limitation on a substrate which can be used as the substrate 400 having an insulating surface, it is necessary that the substrate have at least enough heat resistance to a heat treatment to be performed later. As the substrate 400 having an insulating surface, a glass substrate of barium borosilicate glass, aluminoborosilicate glass, or the like can be used.

In the case where a glass substrate is used and the temperature at which the heat treatment is to be performed later is high, a glass substrate whose strain point is greater than or equal to 730° C. is preferably used. As a glass substrate, for example, a glass material such as aluminosilicate glass, aluminoborosilicate glass, or barium borosilicate glass can be used. In general, a glass substrate containing more barium oxide (BaO) than boron oxide ($B_2O_3$) is more practical as heat-resistant glass. Therefore, a glass substrate containing BaO and $B_2O_3$ so that the amount of BaO is larger than that of $B_2O_3$ is preferably used.

Note that as the above glass substrate, a substrate formed of an insulator such as a ceramic substrate, a quartz substrate, or a sapphire substrate may be used. Alternatively, a crystallized glass substrate or the like can be used. Further alternatively, a plastic substrate or the like can be used as appropriate.

First, the insulating layer 407 serving as a base film is formed over the substrate 400 having an insulating surface. As the insulating layer 407 which is in contact with the oxide semiconductor layer, an oxide insulating layer such as a silicon oxide layer, a silicon oxynitride layer, an aluminum oxide layer, or an aluminum oxynitride layer is preferably used. As a method for forming the insulating layer 407, a plasma CVD method, a sputtering method, or the like can be used; however, it is preferable that the insulating layer 407 be formed by a sputtering method so that the insulating layer 407 does not contain a large amount of hydrogen.

In this embodiment, a silicon oxide layer is formed as the insulating layer 407 by a sputtering method. The substrate 400 is transferred to a treatment chamber, a sputtering gas which contains high-purity oxygen and from which hydrogen and moisture have been removed is introduced thereinto, and a silicon oxide layer is formed over the substrate 400 as the insulating layer 407 using a silicon target. The temperature of the substrate 400 may be room temperature, or the substrate 400 may be heated.

For example, a silicon oxide layer is formed by an RF sputtering method using quartz (preferably, synthetic quartz) in an atmosphere containing oxygen and argon (the flow ratio of oxygen to argon is 1:1 (each flow rate is 25 sccm)), under conditions where a substrate temperature is 108° C., the distance between the substrate and the target (the T-S distance) is 60 mm, the pressure is 0.4 Pa, and the high-frequency power is 1.5 kW. The thickness of the layer is 100 nm. Note that instead of quartz (preferably, synthetic quartz), a silicon target can be used as a target for deposition of the silicon oxide layer. As a sputtering gas, an oxygen gas or a mixed gas of oxygen and argon is used.

In this case, it is preferable that the insulating layer 407 be formed while moisture remaining in the treatment chamber is removed so that the insulating layer 407 does not contain hydrogen, hydroxyl, or moisture.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with use of the cryopump, a hydrogen atom, a compound containing a hydrogen atom such as moisture ($H_2O$), and the like are removed, whereby the impurity concentration in the insulating layer 407 formed in the treatment chamber can be reduced.

As a sputtering gas used in depositing the insulating layer 407, a high-purity gas is preferably used, in which impurities such as hydrogen, moisture, hydroxyl or hydride are removed so that the concentration is approximately several parts per million or approximately several parts per billion.

Examples of a sputtering method include an RF sputtering method in which a high-frequency power source is used for a sputtering power supply, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

The insulating layer 407 can also have a stacked-layer structure. For example, a nitride insulating layer such as a silicon nitride layer, a silicon nitride oxide layer, an aluminum nitride layer, or an aluminum nitride oxide layer and the above-described oxide insulating layer may be stacked in this order over the substrate 400.

For example, a sputtering gas which contains high-purity nitrogen and from which hydrogen and moisture have been removed is introduced between the silicon oxide layer and the substrate to form a silicon nitride layer using a silicon target. In this case also, it is preferable that the silicon nitride layer be formed while moisture remaining in the treatment chamber is removed in a manner similar to that of the silicon oxide layer.

Also in the case of forming the silicon nitride layer, the substrate may be heated at the time of deposition.

In the case where the silicon nitride layer and the silicon oxide layer are stacked as the insulating layer 407, the silicon nitride layer and the silicon oxide layer can be formed in one treatment chamber using the same silicon target. First, a sputtering gas containing nitrogen is introduced and a silicon nitride layer is formed using a silicon target placed inside the treatment chamber, and then the sputtering gas is switched to a sputtering gas containing oxygen and a silicon oxide layer is formed using the same silicon target. Since the silicon nitride layer and the silicon oxide layer can be formed in succession without exposure to the air, impurities such as hydrogen or moisture can be prevented from being adsorbed on the surface of the silicon nitride layer.

Then, an oxide semiconductor film is formed to a thickness of greater than or equal to 2 nm and less than or equal to 200 nm over the insulating layer 407.

In addition, in order that hydrogen, hydroxyl, and moisture are contained as little as possible in the oxide semiconductor film, it is preferable that the substrate 400 over which the insulating layer 407 is formed be preheated in a preheating chamber of the sputtering apparatus, so that impurities such as hydrogen or moisture adsorbed on the substrate 400 are eliminated and removed, as a pretreatment before deposition. As an evacuation unit provided for the preheating chamber, a cryopump is preferably used. Note that this preheating treatment can be omitted. This preheating may be similarly performed on the substrate 400 before deposition of the gate insulating layer 402 which is formed later, or on the substrate 400 before formation of the source or drain electrode layer 415a and the source or drain electrode layer 415b which are formed later.

Note that before the oxide semiconductor film is formed by a sputtering method, powdery substances (also referred to as particles or dust) attached on a surface of the insulating layer 407 are preferably removed by reverse sputtering in which an argon gas is introduced and plasma is generated. The reverse sputtering refers to a method in which, without application of a voltage to a target side, a high-frequency power source is used for application of a voltage to a substrate side in an argon atmosphere and plasma is generated in the vicinity of the substrate to modify a surface. Note that instead of an argon atmosphere, a nitrogen atmosphere, a helium atmosphere, an oxygen atmosphere, or the like may be used.

The oxide semiconductor film is formed by a sputtering method. As a sputtering target, the target described in Embodiment 1 in which the concentration of hydrogen contained is reduced is used.

As the oxide semiconductor film, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; or a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; or a single-component metal oxide film such as an In—O-based film, a Sn—O-based film, or a Zn—O-based film can be used. In addition, the above oxide semiconductor film may contain $SiO_2$.

As the oxide semiconductor film, a thin film represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is represented by $InMO_3(ZnO)_m$ (m>0) where at least Ga is included as M is referred to as the In—Ga—Zn—O-based oxide semiconductor described above, and a thin film thereof is also referred to as an In—Ga—Zn—O-based film.

As a sputtering gas used in forming the oxide semiconductor film, a high-purity gas is preferably used, in which impurities such as hydrogen, moisture, hydroxyl or hydride are removed so that the concentration is approximately several parts per million or approximately several parts per billion.

As a target for forming the oxide semiconductor film by a sputtering method, an oxide semiconductor target for film formation including zinc oxide as a main component can be used. As another example of an oxide semiconductor target for film formation, an oxide semiconductor target for film formation including In, Ga, and Zn (composition ratio of $In_2O_3:Ga_2O_3:ZnO=1:1:1$ [molar ratio]) can be used. As the oxide semiconductor target for film formation containing In, Ga, and Zn, a target having a composition ratio of $In_2O_3:Ga_2O_3:ZnO=1:1:2$ (molar ratio) or a target having a composition ratio of $In_2O_3:Ga_2O_3:ZnO=1:1:4$ (molar ratio) can also be used. The filling rate of the oxide semiconductor target for film formation is higher than or equal to 90% and lower than or equal to 100%, preferably higher than or equal to 95% and lower than or equal to 99.9%. With the use of the oxide semiconductor target for film formation with a high filling rate, a dense oxide semiconductor film is formed.

The oxide semiconductor film is formed in the following manner: the substrate is held in the treatment chamber which is kept in a reduced pressure state, a sputtering gas from which hydrogen and moisture are removed is introduced into the treatment chamber while removing moisture remaining therein, and the oxide semiconductor film is formed over the substrate 400 using a metal oxide as a target. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as moisture ($H_2O$), (preferably, also a compound containing a carbon atom), and the like are removed, whereby the concentration of impurities in the oxide semiconductor film formed in the treatment chamber can be reduced. The substrate may be heated when the oxide semiconductor film is formed.

As one example of deposition conditions, conditions where the substrate temperature is room temperature, the distance between the substrate and the target is 110 mm, the pressure is 0.4 Pa, the direct-current (DC) power is 0.5 kW, and the atmosphere is an atmosphere of oxygen and argon (the flow rate of oxygen is 15 sccm, and the flow rate of argon is 30 sccm), are applied. Note that when a pulse direct-current (DC) power source is used, powder substances (also referred to as particles or dust) generated in film deposition can be reduced and the film thickness is likely to be uniform. The oxide semiconductor film preferably has a thickness of 5 nm to 30 nm inclusive. Note that an appropriate thickness differs depending on an oxide semiconductor material, and the thickness may be set as appropriate depending on the material.

Figure 3A:
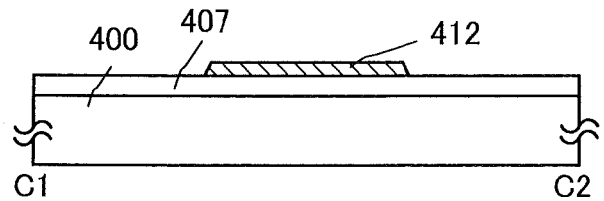
FIGS. 3A to 3E illustrate a manufacturing process of a transistor according to an embodiment.
Figure 3B:
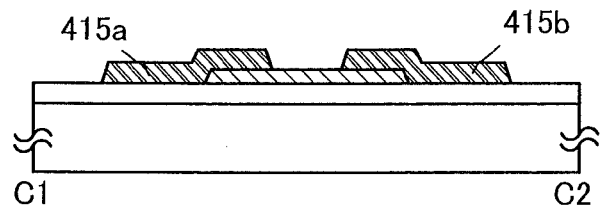

Next, the oxide semiconductor film is processed into an island-shaped oxide semiconductor layer 412 in a first photolithography step (see FIG. 3A). Further, a resist mask for forming the island-shaped oxide semiconductor layer 412 may be formed using an ink jet method. Formation of the resist mask by an inkjet method needs no photomask; thus, manufacturing cost can be reduced.

For the etching of the oxide semiconductor film, wet etching, dry etching, or both of them may be employed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by KANTO CHEMICAL CO., INC.) or the like may also be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

In this embodiment, the oxide semiconductor film is processed into the island-shaped oxide semiconductor layer 412 by a wet etching method using a mixed solution of phosphoric acid, acetic acid, and nitric acid as an etchant.

In this embodiment, first heat treatment is performed on the oxide semiconductor layer 412. Here, the first heat treatment is performed at higher than or equal to 400° C. and lower than or equal to 750° C., preferably, higher than or equal to 400° C. and lower than a strain point of the substrate. In this embodiment, the substrate is put in an electric furnace which is one of heat treatment apparatuses and heat treatment is performed on the oxide semiconductor layer in a nitrogen atmosphere at 450° C. for one hour, and then the oxide semiconductor layer is not exposed to air so that entry of moisture and hydrogen is prevented; thus, the oxide semiconductor layer is obtained. By this first heat treatment, dehydration or dehydrogenation can be performed on the oxide semiconductor layer 412.

Note that the heat treatment apparatus is not limited to an electronic furnace, and may be provided with a device that heats an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed. With GRTA, high-temperature heat treatment for a short period of time can be achieved.

Note that in the first heat treatment, it is preferable that moisture, hydrogen, and the like be not contained in nitrogen or a rare gas such as helium, neon, or argon. It is preferable that the purity of nitrogen or the rare gas such as helium, neon, or argon which is introduced into a heat treatment apparatus be set to be 6 N (99.9999%) or higher, preferably 7 N (99.99999%) or higher (that is, the impurity concentration is 1 ppm or lower, preferably 0.1 ppm or lower).

The oxide semiconductor layer may be crystallized to be a microcrystalline film or a polycrystalline film, depending on the condition of the first heat treatment or the material of the oxide semiconductor layer. For example, the oxide semiconductor layer may crystallize to become a microcrystalline oxide semiconductor film having a degree of crystallization of 90% or more, or 80% or more. Alternatively, depending on the condition of the first heat treatment and the material for the oxide semiconductor layer, the oxide semiconductor layer might become an amorphous oxide semiconductor film containing no crystalline component. The oxide semiconductor layer may become an oxide semiconductor film in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

The first heat treatment for the oxide semiconductor layer can be performed before the oxide semiconductor film is processed into the island-shaped oxide semiconductor layer. In that case, the substrate is taken out from the heat apparatus after the first heat treatment, and then a photolithography step is performed.

The heat treatment having an effect of dehydration or dehydrogenation of the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Next, a conductive film is formed over the insulating layer 407 and the oxide semiconductor layer 412. The conductive film may be formed by a sputtering method or a vacuum evaporation method. As the material of the conductive film, it is possible to use an element selected from aluminum (Al), chromium (Cr), copper (Cu), tantalum (Ta), titanium (Ti), molybdenum (Mo), and tungsten (W), an alloy containing any of the elements, an alloy film combining the elements, or the like. Alternatively, one or more materials selected from manganese (Mn), magnesium (Mg), zirconium (Zr), beryllium (Be), and thorium (Th) may be used. Further, the conductive film may have a single-layer structure or a stacked-layer structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

A resist mask is formed over the conductive film in a second photolithography step. Selective etching is performed so that the source or drain electrode layer 415a and the source or drain electrode layer 415b are formed. Then, the resist mask is removed (see FIG. 3B). It is preferable that end portions of the formed source electrode layer and drain electrode layer have tapered shapes, so that coverage with a gate insulating layer stacked thereover is improved.

In this embodiment, a titanium film with a thickness of 150 nm is formed as the source or drain electrode layer 415a and the source or drain electrode layer 415b by a sputtering method.

Note that each material and etching conditions are adjusted as appropriate so that the oxide semiconductor layer 412 is not removed and the insulating layer 407 thereunder is not exposed when the conductive film is etched.

In this embodiment, a titanium film is used as the conductive film, an In—Ga—Zn—O-based oxide semiconductor is used as the oxide semiconductor layer 412, and an ammonia hydrogen peroxide solution (a mixture of ammonia, water, and a hydrogen peroxide solution) is used as an etchant for the titanium film.

In the second photolithography step, only part of the oxide semiconductor layer 412 may be etched off, whereby an oxide semiconductor layer having a groove (a depressed portion) may be formed. The resist mask used for forming the source or drain electrode layer 415a and the source or drain electrode layer 415b may be formed by an inkjet method. Formation of the resist mask by an inkjet method needs no photomask; thus, manufacturing cost can be reduced.

In light exposure for formation of the resist mask in the second photolithography step, ultraviolet light, KrF laser light, or ArF laser light is used. A channel length L of the transistor formed later is determined by the distance between the lower edge portion of the source electrode layer and the lower edge portion of the drain electrode layer which are next to each other over the oxide semiconductor layer 412. When light exposure is performed in the case where the channel length L is shorter than 25 nm, light exposure for forming the resist mask in the second photolithography step is performed using extreme ultraviolet with extremely short wavelength of several nanometers to several tens of nanometers. In light exposure using extreme ultraviolet, resolution is high and depth of focus is large. Therefore, the channel length L of the transistor formed later can be 10 nm to 1000 nm inclusive, operation speed of the circuit can be increased, and power consumption can be reduced because an off-state current value is extremely small.

Figure 3C:
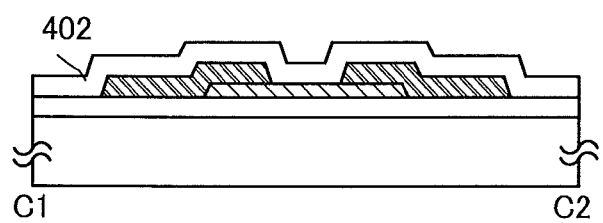

Next, the gate insulating layer 402 is formed over the insulating layer 407, the oxide semiconductor layer 412, the source or drain electrode layer 415a, and the source or drain electrode layer 415b (see FIG. 3C).

An i-type or substantially i-type oxide semiconductor achieved by the removal of impurities (a highly purified oxide semiconductor) is extremely sensitive to interface level or interface charge. Therefore, an interface between an oxide semiconductor layer and a gate insulating film is an important factor. Thus, higher quality is demanded for the gate insulating film (GI) in contact with the highly purified oxide semiconductor.

For example, a high-density plasma CVD method using microwaves (2.45 GHz) is preferable because a dense and high-quality insulating film having high withstand voltage can be formed. The highly purified oxide semiconductor and the high-quality gate insulating film are in close contact with each other, whereby the interface level can be reduced and interface characteristics can be improved.

In addition, since the insulating film formed using the high-density plasma CVD apparatus can have a uniform thickness, the insulating film has excellent step coverage. Further, as for the insulating film formed using the high-density plasma CVD apparatus, the thickness of a thin film can be controlled precisely.

Needless to say, another deposition method such as a sputtering method or a plasma CVD method can be applied as long as a high-quality insulating film can be formed as a gate insulating film. Further, an insulating film whose film quality and interface characteristics with the oxide semiconductor are improved by heat treatment performed after formation of the insulating film may be formed. In any case, any insulating film that has a reduced interface state density with the oxide semiconductor and can form a favorable interface as well as having a favorable film quality as a gate insulating film can be used.

Further, when an oxide semiconductor containing impurities is subjected to a gate bias-temperature stress test (BT test) at 85° C., at a voltage applied to the gate of $2\times10^6$ V/cm, for 12 hours, a bond between the impurity and a main component of the oxide semiconductor is cleaved by a high electric field (B: bias) and a high temperature (T: temperature), and a generated dangling bond induces shift in the threshold voltage ($V_{th}$). In contrast, the present invention makes it possible to obtain a transistor which is stable to a BT test by removing impurities in an oxide semiconductor, especially hydrogen, moisture, and the like as much as possible to obtain a favorable characteristic of an interface between the oxide semiconductor and a gate insulating film as described above.

The gate insulating layer can be formed in a single layer or a stacked layer using a silicon oxide layer, a silicon nitride layer, a silicon oxynitride layer, a silicon nitride oxide layer, or an aluminum oxide layer.

The gate insulating layer is formed using a high-density plasma CVD apparatus. Here, a high-density plasma CVD apparatus refers to an apparatus which can realize a plasma density of $1\times10^{11}/cm^3$ or higher. For example, plasma is generated by applying a microwave power higher than or equal to 3 kW and lower than or equal to 6 kW so that an insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that an insulating film is formed over a substrate having an insulating surface, such as a glass substrate. After that, supply of a monosilane gas ($SiH_4$) may be stopped, and nitrous oxide ($N_2O$) and a rare gas may be introduced without exposure to the air to perform plasma treatment on a surface of the insulating film. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Unlike an insulating film formed using a conventional parallel plate plasma CVD apparatus in many points, the insulating film formed through the above process procedure has an etching rate which is lower than that of the insulating film formed using the conventional parallel plate plasma CVD apparatus by greater than or equal to 10% or greater than or equal to 20% in the case where the etching rates with the same etchant are compared with each other. Thus, it can be said that the insulating film obtained using a high-density plasma CVD apparatus is a dense film.

In this embodiment, a silicon oxynitride film (also referred to as $SiO_xN_y$ (x>y>0)) having a thickness of 100 nm is used as the gate insulating layer 402. The gate insulating layer 402 is formed in such a manner that monosilane ($SiH_4$), nitrous oxide ($N_2O$), and argon (Ar) are used as film formation gases at flow rate of $SiH_4/N_2O/Ar$=250/2500/2500 (sccm) in a high-density plasma CVD apparatus, and plasma is generated by applying a microwave power of 5 kW at a film formation pressure of 30 Pa and a film formation temperature of 325° C.

Alternatively, the gate insulating layer 402 may be formed by a sputtering method. In the case where a silicon oxide film is formed by a sputtering method, a silicon target or a quartz target is used as a target, and oxygen or a mixed gas of oxygen and argon is used as a sputtering gas. With the use of a sputtering method, the gate insulating layer 402 does not contain a large amount of hydrogen.

The gate insulating layer 402 can have a structure in which a silicon oxide layer and a silicon nitride layer are stacked in this order over the source or drain electrode layer 415a and the source or drain electrode layer 415b. For example, the gate insulating layer 402 having a thickness of 100 nm may be formed in such a manner that a silicon oxide layer ($SiO_x$ (x>0)) having a thickness of 5 nm to 300 nm inclusive (50 nm in this embodiment) is formed as a first gate insulating layer and a silicon nitride layer ($SiN_y$ (y>0)) having a thickness of 50 nm to 200 nm inclusive (50 nm in this embodiment) is stacked over the first gate insulating layer as a second gate insulating layer by a sputtering method. For example, a silicon oxide layer with a thickness of 100 nm can be formed by an RF sputtering method in an atmosphere containing oxygen and argon (the flow ratio of oxygen to argon is 1:1 (each flow rate is 25 sccm)), under conditions where the pressure is 0.4 Pa, and the high-frequency power is 1.5 kW.

Figure 3D:
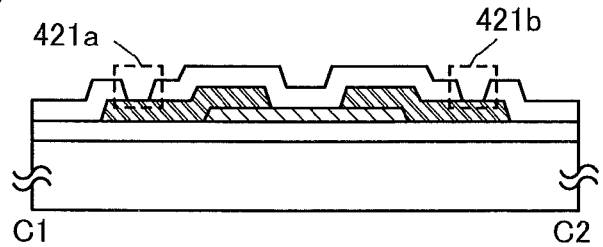

Next, a resist mask is formed in a third photolithography step and part of the gate insulating layer 402 is removed by performing selective etching, so that an opening 421a and an opening 421b are formed respectively to reach the source or drain electrode layer 415a and the source or drain electrode layer 415b (see FIG. 3D).

Then, after a conductive film is formed over the gate insulating layer 402 and in and on the opening 421a and the opening 421b, the gate electrode layer 411, the wiring layer 414a, and the wiring layer 414b are formed in a fourth photolithography step. Note that a resist mask may be formed by an inkjet method. Formation of the resist mask by an inkjet method needs no photomask; thus, manufacturing cost can be reduced.

The gate electrode layer 411, the wiring layer 414a, and the wiring layer 414b can be formed as a single layer or a stacked layer using a metal material such as molybdenum, titanium, chromium, tantalum, tungsten, aluminum, copper, neodymium, or scandium or an alloy material which contains any of these materials as its main component.

For example, as a two-layer structure of each of the gate electrode layer 411, the wiring layer 414a, and the wiring layer 414b, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can be formed using a light-transmitting conductive film. As an example of the light-transmitting conductive film, a light-transmitting conductive oxide or the like can be given.

In this embodiment, a titanium film with a thickness of 150 nm is formed as the gate electrode layer 411, the wiring layer 414a, and the wiring layer 414b by a sputtering method.

Next, second heat treatment (preferably 200° C. to 400° C. inclusive, more preferably, 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the transistor 410.

Further, heat treatment may be performed at 100° C. to 200° C. inclusive for from one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under the reduced pressure, the heat treatment time can be shortened.

Figure 3E:
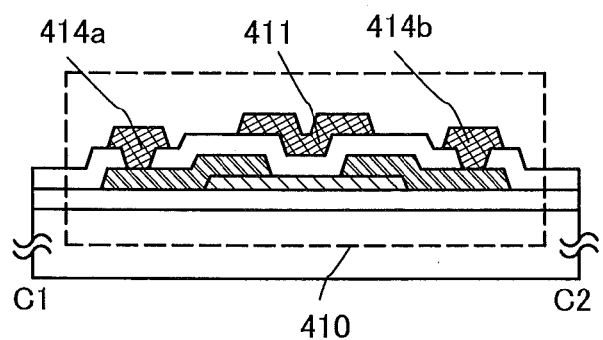

Through the above-described process, the transistor 410 including the oxide semiconductor layer 412 in which the concentration of hydrogen, moisture, hydride, or hydroxide is reduced can be formed (see FIG. 3E).

In addition, a protective insulating layer or a planarization insulating layer for planarization may be formed over the transistor 410. For example, a protective insulating layer can be formed to have a single-layer structure or a stacked-layer structure of a silicon oxide layer, a silicon nitride layer, a silicon oxynitride layer, a silicon nitride oxide layer, or an aluminum oxide layer.

The planarization insulating layer can be formed of a heat-resistant organic material, such as polyimide, acrylic, polyimide amide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarization insulating layer may be formed by stacking a plurality of insulating films formed of these materials.

Note that the siloxane resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer, and the planarization insulating layer can be formed, depending on the material, by a method such as a sputtering method, an SOG method, spin coating, dipping, spray coating, or a droplet discharge method (such as an inkjet method, screen printing, or offset printing), or with a tool such as a doctor knife, a roll coater, a curtain coater, or a knife coater.

In the transistor described in this embodiment, since the oxide semiconductor film is formed using the sputtering target described in Embodiment 1, the concentration of impurities contained in the oxide semiconductor film can be reduced. When the oxide semiconductor film is formed in the above manner, moisture remaining in a reaction atmosphere is removed; thus, the concentration of hydrogen and that of hydride in the oxide semiconductor film can be further reduced. Thus, the oxide semiconductor film can be stabilized.

In the transistor according to one embodiment of the present invention, the carrier density of an oxide semiconductor film used for an active layer is lower than or equal to $1\times10^{12}/cm^3$, preferably, lower than or equal to $1\times10^{11}/cm^3$. That is, the carrier density of the oxide semiconductor layer is lower than or equal to the measurement limit and made as close to zero as possible.

By applying a highly purified oxide semiconductor layer to a transistor as described above, a transistor whose off-state current is reduced, for example, to $1\times10^{-13}$ A or lower can be provided.

As an example of a semiconductor material to be compared with an oxide semiconductor, silicon carbide (for example, 4H—SiC) is given. An oxide semiconductor and 4H—SiC has some common features. The carrier density is one example thereof. In accordance with Fermi-Dirac distribution, the number of minority carriers of the oxide semiconductor is estimated to be $1\times10^{-7}/cm^3$, which is an extremely low value, similarly to $6.7\times10^{-11}/cm^3$ in 4H—SiC. In comparison with the intrinsic carrier density (approximately $1.4\times10^{10}/cm^3$) of silicon, it is well understood that the degree is extraordinary.

In addition, since the energy band gap of an oxide semiconductor is 3.0 eV to 3.5 eV and the energy band gap of 4H—SiC is 3.26 eV, an oxide semiconductor and silicon carbide are in common in that both are wide-gap semiconductors.

On the other hand, there is a significant difference between an oxide semiconductor and silicon carbide. That is a processing temperature. Since heat treatment at 1500° C. to 2000° C. is needed for silicon carbide in general, a stacked-layer structure of silicon carbide and a semiconductor element formed using another semiconductor material is difficult to be formed. This is because a semiconductor substrate or a semiconductor element is destroyed with such high temperature. On the other hand, an oxide semiconductor can be manufactured by heat treatment at 300° C. to 500° C. (lower than or equal to the glass transition temperature, approximately 700° C. at maximum); therefore, a semiconductor element formed using an oxide semiconductor can be formed after an integrated circuit is formed using another semiconductor material.

In addition, an oxide semiconductor has an advantage that a substrate with low heat resistance such as a glass substrate can be used, which is different from the case of silicon carbide. Further, a forming process of an oxide semiconductor has an advantage that energy cost can be sufficiently reduced compared to that of silicon carbide, because heat treatment at high temperature is not needed.

An oxide semiconductor is generally considered as an n-type semiconductor; however, according to one embodiment of the invention disclosed herein, an i-type semiconductor is realized by removing impurities, particularly moisture and hydrogen. In this respect, it can be said that one embodiment of the invention disclosed herein includes a novel technical idea because the oxide semiconductor according to one embodiment of the invention is made to be i-type in a manner different from that of silicon and the like made to be i-type by addition of an impurity.

<Electrical Conduction Mechanism of Transistor Including Oxide Semiconductor>

Here, the electrical conduction mechanism of a transistor manufactured using an oxide semiconductor is described with reference to FIG. 12, FIG. 13, FIGS. 14A and 14B, and FIG. 15. Note that the following description is only a consideration, and the effectiveness of the invention is not denied according thereto.

Figure 12:
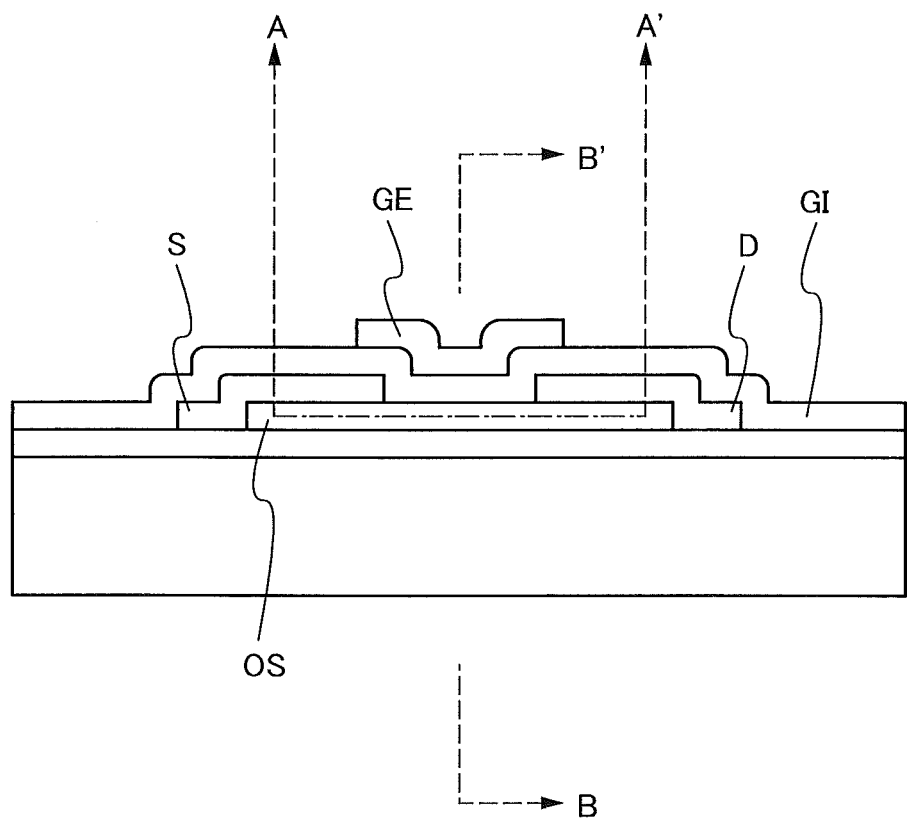
FIG. 12 is a longitudinal sectional view illustrating a top-gate transistor using an oxide semiconductor.

FIG. 12 is a longitudinal sectional view of a top-gate transistor manufactured using an oxide semiconductor. An oxide semiconductor layer (OS) is provided below a gate electrode (GE) with a gate insulating film (GI) interposed therebetween, and a source electrode (S) and a drain electrode (D) are provided thereover.

Figure 13:
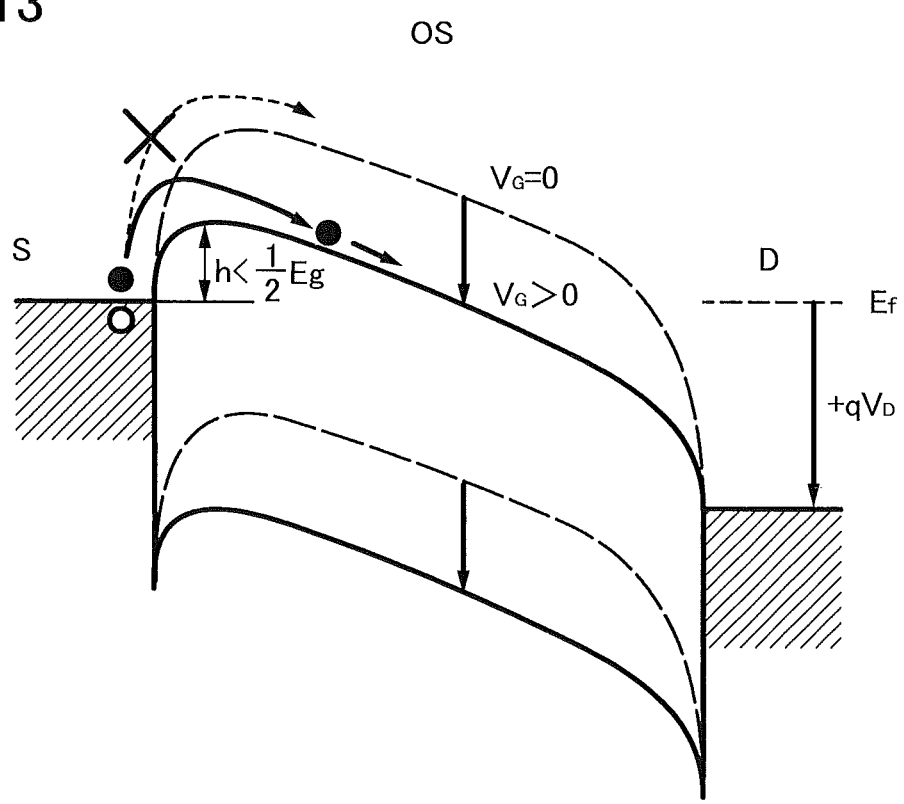
FIG. 13 is an energy band diagram (schematic diagram) of a cross section along line A-A' illustrated in FIG. 12.

FIG. 13 illustrate schematic diagrams of an energy band structure of a cross section taken along line A-A' in FIG. 12. In FIG. 13, a black circle (●) and a white circle (○) represent an electron and a hole and have electric charges (−q, +q), respectively. FIG. 13 illustrates the case where a positive voltage ($V_D$>0) is applied to the drain and a voltage is not applied to a gate electrode ($V_G$=0) (shown by dashed lines) or a positive voltage is applied to the gate electrode ($V_G$>0) (shown by solid lines). In the case where a voltage is not applied to the gate electrode, carriers (electrons) are not injected from the source electrode to the oxide semiconductor side because of high potential barrier, so that no current flows, which means an off state. On the other hand, when positive voltage is applied to the gate electrode, the height of the potential barrier is reduced, so that current flows, which means an on state.

Figure 14A:
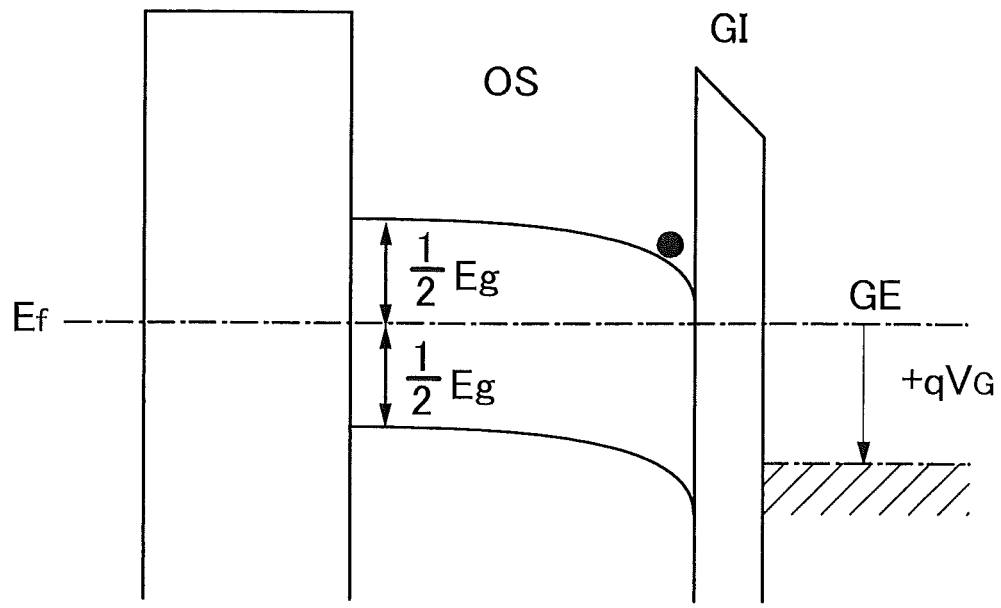
FIG. 14A illustrates a state where a positive voltage ($V_G>0$) is applied to a gate (GE) and FIG. 14B illustrates a state where a negative voltage ($V_G>0$) is applied to the gate (GE).
Figure 14B:
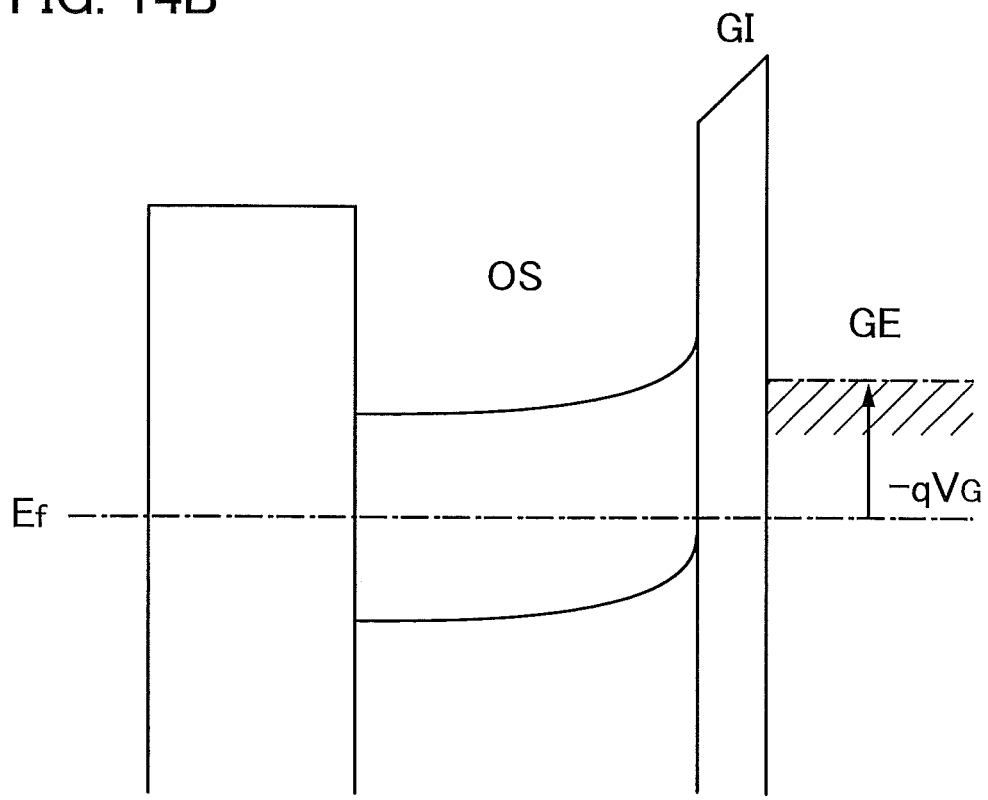

FIGS. 14A and 14B are energy band diagrams (schematic diagrams) of a cross section taken along line B-B' in FIG. 12. FIG. 14A illustrates an on state in which a positive voltage ($V_G$>0) is applied to the gate electrode (GE) and carriers (electrons) flow between the source electrode and the drain electrode. FIG. 14B illustrates an off state in which a negative voltage $V_G$ ($V_G$<0) is applied to the gate electrode (GE) and minority carriers do not flow.

Figure 15:
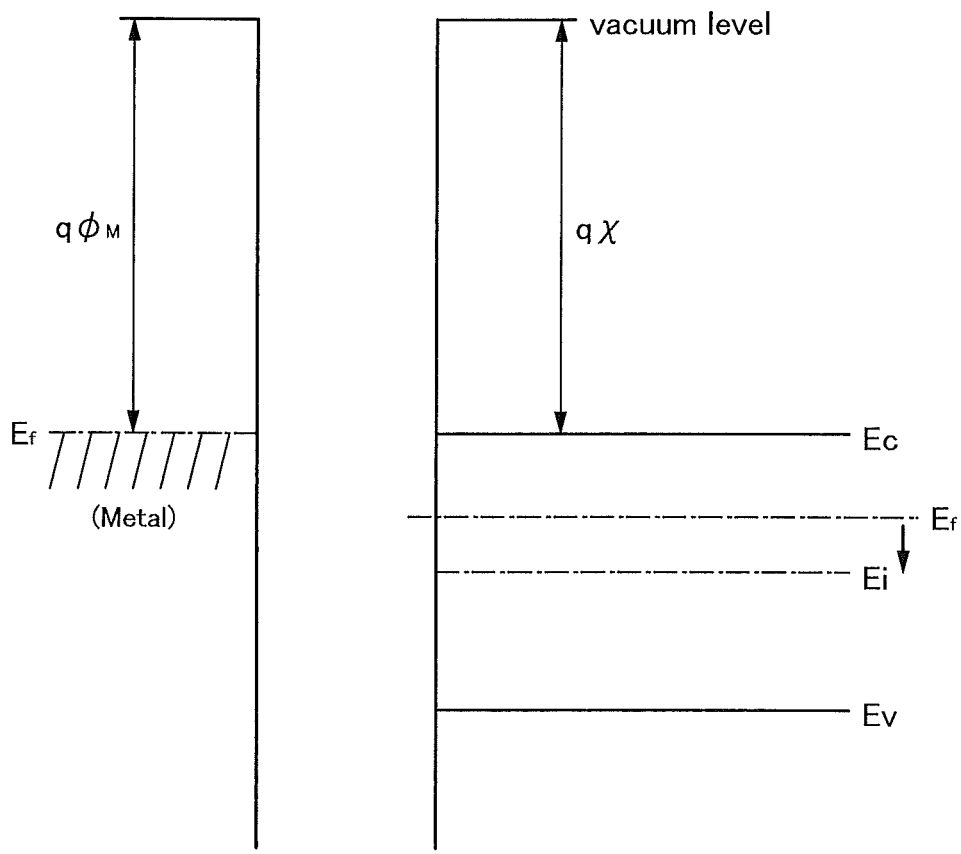
FIG. 15 is a diagram illustrating the relations between the vacuum level and the work function of a metal ($\phi_M$) and between the vacuum level and the electron affinity ($\chi$) of an oxide semiconductor.

FIG. 15 illustrates the relations between the vacuum level and the work function of a metal ($\phi_M$) and between the vacuum level and the electron affinity ($\chi$) of an oxide semiconductor.

At normal temperature, electrons in metal are degenerated, and the Fermi level is positioned in the conduction band. A conventional oxide semiconductor is typically an n-type semiconductor, in which case the Fermi level ($E_f$) is away from the intrinsic Fermi level ($E_i$) located in the middle of the band gap and is located closer to the conduction band. Note that it is known that part of hydrogen serves as a donor in an oxide semiconductor and is one factor causing an oxide semiconductor to be an n-type semiconductor.

On the other hand, an oxide semiconductor of the present invention is an intrinsic (i-type) or a substantially intrinsic oxide semiconductor which is obtained by removing hydrogen that is an n-type impurity from an oxide semiconductor and purifying the oxide semiconductor so that impurities that are not main components of the oxide semiconductor is prevented from being contained therein as much as possible. In other words, a feature of an oxide semiconductor is that a purified i-type (intrinsic) semiconductor, or a semiconductor close thereto, is obtained not by adding impurities but by removing impurities such as hydrogen or moisture as much as possible. This enables the Fermi level ($E_f$) to be at substantially the same level as the intrinsic Fermi level ($E_i$).

It is said that the bang gap ($E_g$) of an oxide semiconductor is 3.15 eV, and the electron affinity ($\chi$) thereof is 4.3 V. The work function of titanium (Ti) included in the source electrode and the drain electrode is substantially equal to the electron affinity ($\chi$) of the oxide semiconductor. In the case where titanium is used for the source electrode and the drain electrode, the Schottky electron barrier is not formed at an interface between the metal and the oxide semiconductor.

In this case, as illustrated in FIG. 14A, the electron moves along the lowest region of the oxide semiconductor, which is energetically stable, at an interface between the gate insulating film and the highly purified oxide semiconductor.

In addition, in FIG. 14B, when a negative potential is applied to the gate electrode (GE), the number of holes that are minority carriers is substantially zero, and the value of current is extremely close to zero.

For example, even when a transistor has a channel width W of $1\times10^4$ µm and a channel length L of 3 µm, a transistor whose off-state current is $10^{-13}$ A or less and the subthreshold swing (S value) is 0.1 V/dec. (the thickness of the gate insulating film: 100 nm) is obtained.

As described above, the oxide semiconductor is purified so that the amount of impurities that are not main components of the oxide semiconductor is minimized, whereby favorable operation of the transistor can be obtained.

This embodiment can be implemented in appropriate combination with the structures described in the other embodiments.

Embodiment 3

In this embodiment, an example of manufacturing a transistor as a semiconductor device which is manufactured using the target in Embodiment 1 will be described. Note that the same portions as in Embodiment 2 or portions having functions similar to those in Embodiment 2, and steps for forming such portions may be similar to those in Embodiment 2, and repetitive description thereof will be omitted. In addition, detailed description of the same portions is not repeated. In a transistor 460 described in this embodiment, an oxide semiconductor film which is formed using the sputtering target described in Embodiment 1 can be used as an active layer.

One embodiment of a transistor and one embodiment of a method for manufacturing the transistor in this embodiment will be described with reference to FIGS. 4A and 4B and FIGS. 5A to 5E.

Figure 4A:
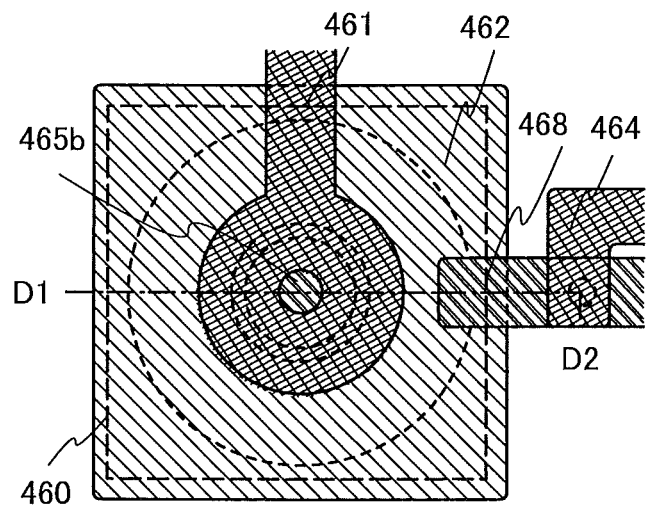
FIGS. 4A and 4B are a plan view and a cross-sectional view of a transistor according to an embodiment, respectively.
Figure 4B:
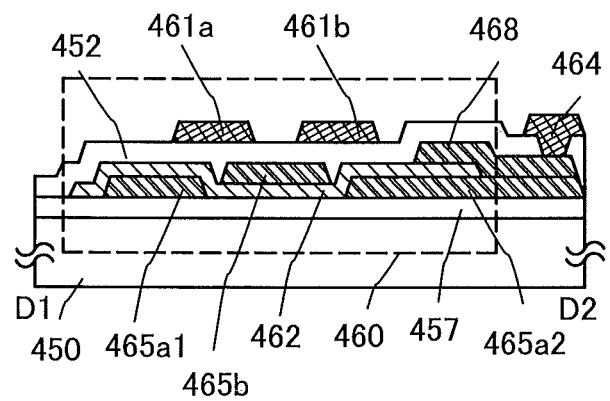

An example of a plan structure and a cross-sectional structure of a transistor are illustrated in FIGS. 4A and 4B, respectively. The transistor 460 illustrated in FIGS. 4A and 4B is one of top-gate transistors.

FIG. 4A is a plan view of the top-gate transistor 460, and FIG. 4B is a cross-sectional view taken along line D1-D2 in FIG. 4A.

The transistor 460 includes an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b) over a substrate 450 having an insulating surface. The source or drain electrode layer 465a (465a1 and 465a2) is electrically connected to a wiring layer 464 through the wiring layer 468. Further, although not illustrated, the source or drain electrode layer 465b is also electrically connected to a wiring layer through an opening provided in the gate insulating layer 452.

Hereinafter, a process of manufacturing the transistor 460 over the substrate 450 will be described with reference to FIGS. 5A to 5E.

First, the insulating layer 457 serving as a base film is formed over the substrate 450 having an insulating surface.

In this embodiment, a silicon oxide layer is formed as the insulating layer 457 by a sputtering method. The silicon oxide layer is formed as the insulating layer 457 over the substrate 450 in such a manner that the substrate 450 is transferred to a treatment chamber, a sputtering gas which contains high-purity oxygen and from which hydrogen and moisture have been removed is introduced, and a silicon target or quartz (preferably synthetic quartz) is used. As a sputtering gas, an oxygen gas or a mixed gas of oxygen and argon is used.

For example, a silicon oxide layer is formed with an RF sputtering method under the following condition: the purity of a sputtering gas is 6 N (99.9999%); quartz (preferably, synthetic quartz) is used; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm)). The thickness of the layer is 100 nm. Note that instead of quartz (preferably, synthetic quartz), a silicon target can be used as a target for formation of the silicon oxide layer.

In this case, it is preferable that the insulating layer 457 be formed while moisture remaining in the treatment chamber is removed so that the insulating layer 457 does not contain hydrogen, hydroxyl, or moisture. In the treatment chamber which is evacuated with the cryopump, a hydrogen atom, a compound containing a hydrogen atom such as moisture ($H_2O$), and the like are removed, whereby the concentration of impurities in the insulating layer 457 in the case of being formed in the treatment chamber can be reduced.

As a sputtering gas used in forming the insulating layer 457, a high-purity gas is preferably used, in which impurities such as hydrogen, moisture, hydroxyl or hydride are removed so that the concentration is approximately several parts per million or approximately several parts per billion.

The insulating layer 457 may have a stacked-layer structure and, for example, may have a stacked-layer structure in which a nitride insulating layer such as a silicon nitride layer, a silicon nitride oxide layer, an aluminum nitride layer, or an aluminum nitride oxide layer and the above-described oxide insulating layer are stacked in this order over the substrate 450.

For example, a silicon nitride layer is formed using a silicon target by introducing a sputtering gas which contains high-purity nitrogen and from which hydrogen and moisture have been removed, to a space between the silicon oxide layer and the substrate. In this case also, it is preferable that moisture remaining in the treatment chamber be removed in the formation of the silicon nitride layer in a manner similar to that of the silicon oxide layer.

Figure 5A:
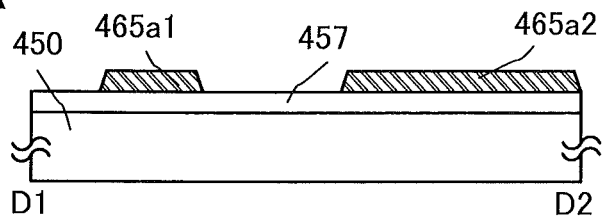
FIGS. 5A to 5E illustrate a manufacturing process of a transistor according to an embodiment.

Next, a conductive film is formed over the insulating layer 457, a resist mask is formed over the conductive film in a first photolithography step, selective etching is performed to form the source or drain electrode layers 465a1 and 465a2, and then the resist mask is removed (see FIG. 5A). The source or drain electrode layers 465a1 and 465a2 are a continuous film, though illustrated as being separated in the cross-sectional view. Note that it is preferable that end portions of the formed source or drain electrode layers 465a1 and 465a2 have tapered shapes so that coverage with a gate insulating layer stacked thereover is improved.

As the material of the source or drain electrode layers 465a1 and 465a2, there are an element selected from Al, Cr, Cu, Ta, Ti, Mo, and W, an alloy containing any of these elements as its component, an alloy containing a combination of any of these elements, and the like. Alternatively, one or more materials selected from manganese (Mn), magnesium (Mg), zirconium (Zr), beryllium (Be), and thorium (Th) may be used. Further, the conductive film may have a single-layer structure or a stacked-layer structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

In this embodiment, a titanium film with a thickness of 150 nm is formed as the source or drain electrode layers 465a1 and 465a2 by a sputtering method.

Next, an oxide semiconductor film with a thickness of 2 nm to 200 nm inclusive is formed over the insulating layer 457 and the source or drain electrode layers 465a1 and 465a2. The oxide semiconductor film is formed using the sputtering target described in Embodiment 1.

Figure 5B:
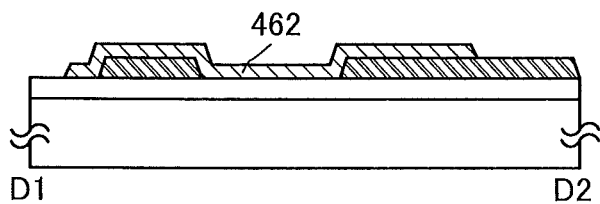

Then, the oxide semiconductor film is processed into an island-shaped oxide semiconductor layer 462 in a second photolithography step (see FIG. 5B). In this embodiment, the oxide semiconductor film is formed by a sputtering method with the use of an In—Ga—Zn—O-based oxide semiconductor target for film formation.

The oxide semiconductor film is formed over the substrate 450 in such a manner that the substrate is held in the treatment chamber which is kept in a reduced pressure state, a sputtering gas from which hydrogen and moisture are removed is introduced into the treatment chamber while removing moisture remaining therein, and a metal oxide is used as a target. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as moisture ($H_2O$), (preferably, also a compound containing a carbon atom), and the like are removed, whereby the concentration of impurities in the oxide semiconductor film formed in the treatment chamber can be reduced. Further, the substrate may be heated at 100° C. to 400° C. at the time of forming the oxide semiconductor film.

As a sputtering gas used in forming the oxide semiconductor film, a high-purity gas is preferably used, in which impurities such as hydrogen, moisture, hydroxyl or hydride are removed so that the concentration is approximately several parts per million or approximately several parts per billion.

An example of the deposition condition is as follows: the substrate temperature is room temperature, the distance between the substrate and the target is 110 mm, the pressure is 0.4 Pa, the direct current (DC) power is 0.5 kW, and the atmosphere is an atmosphere containing oxygen and argon (the flow ratio of oxygen to argon is 15 sccm:30 sccm). Note that when a pulse direct current (DC) power source is used, powder substances (also referred to as particles or dust) generated in film deposition can be reduced and the film thickness is likely to be uniform. The oxide semiconductor film preferably has a thickness of 5 nm to 30 nm inclusive. Note that an appropriate thickness differs depending on an oxide semiconductor material, and the thickness may be set as appropriate depending on the material.

In this embodiment, the oxide semiconductor film is processed into the island-shaped oxide semiconductor layer 462 by a wet etching method using a solution obtained by mixing phosphoric acid, acetic acid, and nitric acid as an etchant.

In this embodiment, first heat treatment is performed on the oxide semiconductor layer 462. Here, the first heat treatment is performed at higher than or equal to 400° C. and lower than or equal to 750° C., preferably, higher than or equal to 400° C. and lower than a strain point of the substrate. In this embodiment, the substrate is put in an electric furnace which is one of heat treatment apparatuses and heat treatment is performed on the oxide semiconductor layer in a nitrogen atmosphere at 450° C. for one hour, and then the oxide semiconductor layer is not exposed to air so that entry of moisture and hydrogen is prevented. In this manner, the oxide semiconductor layer is obtained. Dehydration or dehydrogenation of the oxide semiconductor layer 462 can be performed through this first heat treatment.

Note that the heat treatment apparatus is not limited to an electronic furnace, and may be provided with a device that heats an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. For example, as the first heat treatment, GRTA by which the substrate is moved into an inert gas heated to a high temperature as high as 650° C. to 700° C., heated for several minutes, and moved out of the inert gas heated to the high temperature may be performed. With GRTA, high-temperature heat treatment for a short period of time can be achieved.

Note that in the first heat treatment, it is preferable that moisture, hydrogen, and the like be not contained in nitrogen or a rare gas such as helium, neon, or argon. Alternatively, the purity of the nitrogen or the rare gas such as helium, neon, or argon which is introduced into the heat treatment apparatus is preferably greater than or equal to 6 N (99.9999%) or more preferably greater than or equal to 7 N (99.99999%) (that is, the impurity concentration is less than or equal to 1 ppm, or preferably less than or equal to 0.1 ppm).

Further, the oxide semiconductor layer may be crystallized to be a microcrystalline film or a polycrystalline film, depending on the condition of the first heat treatment or the material of the oxide semiconductor layer.

The first heat treatment for the oxide semiconductor layer can be performed before the oxide semiconductor film is processed into the island-shaped oxide semiconductor layer. In that case, the substrate is taken out from the heat apparatus after the first heat treatment, and then a photolithography step is performed.

The heat treatment having an effect of dehydration or dehydrogenation of the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Figure 5C:
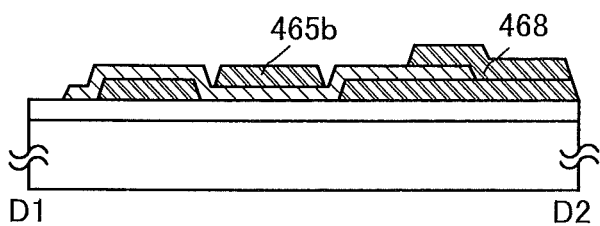

Then, a conductive film is formed over the insulating layer 457, the oxide semiconductor layer 462, and the source or drain electrode layer 465a2, a resist mask is formed over the conductive film in a third photolithography step, selective etching is performed to form the source or drain electrode layer 465b and the wiring layer 468, and then the resist mask is removed (see FIG. 5C). The source or drain electrode layer 465b and the wiring layer 468 may be formed using the same material and in the same step as the source or drain electrode layers 465a1 and 465a2.

In this embodiment, a titanium film with a thickness of 150 nm is formed as the source or drain electrode layer 465b and the wiring layer 468, by a sputtering method. In this embodiment, the same titanium films are used for the source or drain electrode layers 465a1 and 465a2 and the source or drain electrode layer 465b; thus, the etching rate of the source or drain electrode layers 465a1 and 465a2 is the same or substantially the same as that of the source or drain electrode layer 465b. Therefore, in order that the source or drain electrode layers 465a1 and 465a2 be not etched when the source or drain electrode layer 465b is etched, the wiring layer 468 is provided over a part of the source or drain electrode layer 465a2 which is not covered with the oxide semiconductor layer 462. In the case where different materials which provide high selectivity ratio of the source or drain electrode layer 465b to the source or drain electrode layers 465a1 and 465a2 are used, the wiring layer 468 which protects the source or drain electrode layer 465a2 in etching is not necessarily provided.

Note that materials and etching conditions are adjusted as appropriate so that the oxide semiconductor layer 462 is not removed by etching of the conductive film.

In this embodiment, a titanium film is used as the conductive film, an In—Ga—Zn—O-based oxide semiconductor is used as the oxide semiconductor layer 462, and an ammonia hydrogen peroxide solution (a mixture of ammonia, water, and a hydrogen peroxide solution) is used as an etchant for the titanium film.

Note that, in the third photolithography step, only part of the oxide semiconductor layer 462 is etched, whereby an oxide semiconductor layer having a groove (a depressed portion) is formed in some cases. A resist mask used for forming the source or drain electrode layer 465b and the wiring layer 468 may be formed by an inkjet method. Formation of the resist mask by an inkjet method needs no photomask; thus, manufacturing cost can be reduced.

Next, the gate insulating layer 452 is formed over the insulating layer 457, the oxide semiconductor layer 462, the source or drain electrode layers 465a1 and 465a2, and the source or drain electrode layer 465b.

The gate insulating layer 452 can be formed in a single layer or a stacked layer using a silicon oxide layer, a silicon nitride layer, a silicon oxynitride layer, a silicon nitride oxide layer, or an aluminum oxide layer by a plasma CVD method, a sputtering method, or the like. In order to prevent the gate insulating layer 452 from containing a large amount of hydrogen, the gate insulating layer 452 is preferably formed by a sputtering method. In the case where a silicon oxide film is formed by a sputtering method, a silicon target or a quartz target is used as a target, and oxygen or a mixed gas of oxygen and argon is used as a sputtering gas.

The gate insulating layer 452 can have a structure in which a silicon oxide layer and a silicon nitride layer are stacked in this order over the source or drain electrode layers 465a1 and 465a2 and the source or drain electrode layer 465b. In this embodiment, a silicon oxide layer having a thickness of 100 nm is formed by an RF sputtering method under a pressure of 0.4 Pa, a high-frequency power of 1.5 kW, and an atmosphere of oxygen and argon (the flow ratio of oxygen to argon is 1:1 (each flow rate is 25 sccm)).

Figure 5D:
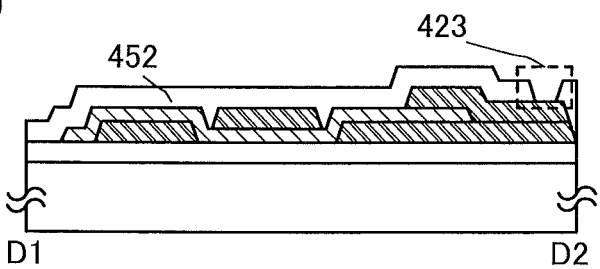

Next in a fourth photolithography step, a resist mask is formed, and selective etching is performed to remove part of the gate insulating layer 452, so that an opening 423 reaching the wiring layer 468 is formed (see FIG. 5D). Although not illustrated, an opening reaching the source or drain electrode layer 465b may be formed at the time of forming the opening 423. In this embodiment, an example is described in which the opening reaching the source or drain electrode layer 465b is formed after an interlayer insulating layer is further stacked, and then a wiring layer for electric connection is formed in the opening.

Then, a conductive film is formed over the gate insulating layer 452 and the opening 423, and the gate electrode layer 461 (461a and 461b) and the wiring layer 464 are formed in a fifth photolithography step. Note that a resist mask may be formed by an inkjet method. Formation of the resist mask by an inkjet method needs no photomask; thus, manufacturing cost can be reduced.

The gate electrode layer 461 (461a and 461b) and the wiring layer 464 can be formed as a single layer or a stacked layer using a metal material such as molybdenum, titanium, chromium, tantalum, tungsten, aluminum, copper, neodymium, or scandium or an alloy material which contains any of these materials as its main component.

In this embodiment, the gate electrode layer 461 (461a and 461b) and the wiring layer 464 are formed using a titanium film having a thickness of 150 nm by a sputtering method.

Next, second heat treatment (for example, at 200° C. to 400° C. inclusive, preferably at 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the transistor 460.

Further, heat treatment may be performed at 100° C. to 200° C. inclusive for from one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under the reduced pressure, the heat treatment time can be shortened.

Figure 5E:
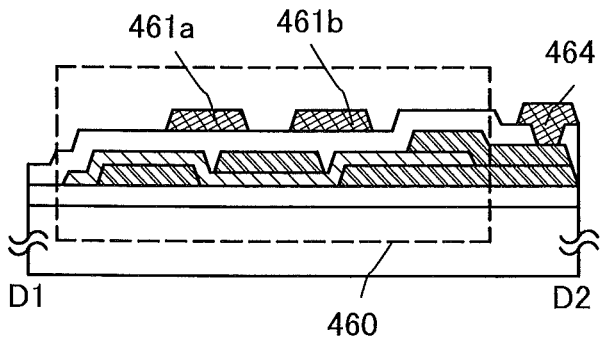

Through the above-described process, the transistor 460 including the oxide semiconductor layer 462 in which the concentration of hydrogen, moisture, hydride, or hydroxide is reduced can be formed (see FIG. 5E).

A protective insulating layer or a planarization insulating layer for planarization may be provided over the transistor 460. Although not illustrated, an opening reaching the source or drain electrode layer 465b is formed in the gate insulating layer 452 and the protective insulating layer or the planarization insulating layer, and a wiring layer electrically connected to the source or drain electrode layer 465b is formed in the opening.

In the transistor described in this embodiment, the oxide semiconductor film is formed using the sputtering target described in Embodiment 1; therefore, the concentration of impurities contained in the oxide semiconductor film can be reduced. When the oxide semiconductor film is formed in the above manner, moisture remaining in a reaction atmosphere is removed; thus, the concentration of hydrogen and that of hydride in the oxide semiconductor film can be further reduced. Thus, the oxide semiconductor film can be stabilized.

By applying a highly purified oxide semiconductor layer to a transistor as described above, a transistor with reduced off-state current can be provided.

This embodiment can be implemented in appropriate combination with the structures described in the other embodiments.

Embodiment 4

In this embodiment, another example of a transistor manufactured using the target in Embodiment 1 is described. Note that the same portions as in Embodiment 2, portions having functions similar to those in Embodiment 2, and steps similar to those in Embodiment 2 may be formed or performed as in Embodiment 2, and description thereof is not repeated. In addition, detailed description of the same portions is not repeated. In each of transistors 425 and 426 described in this embodiment, an oxide semiconductor film which is formed using the target described in Embodiment 1 can be used as an active layer.

The transistors in this embodiment are described with reference to FIGS. 6A and 6B.

Figure 6A:
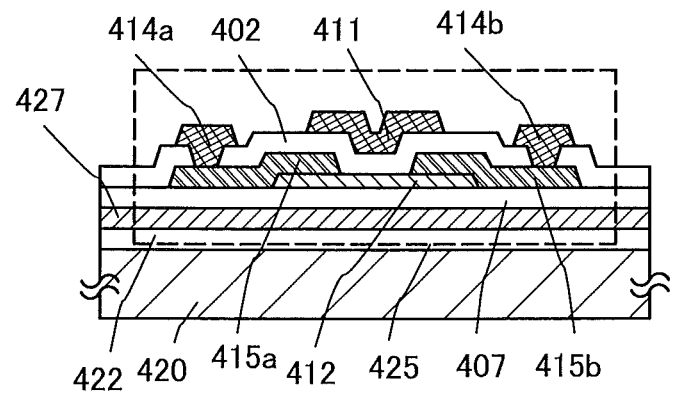
FIGS. 6A and 6B are cross-sectional views of transistors according to an embodiment.
Figure 6B:
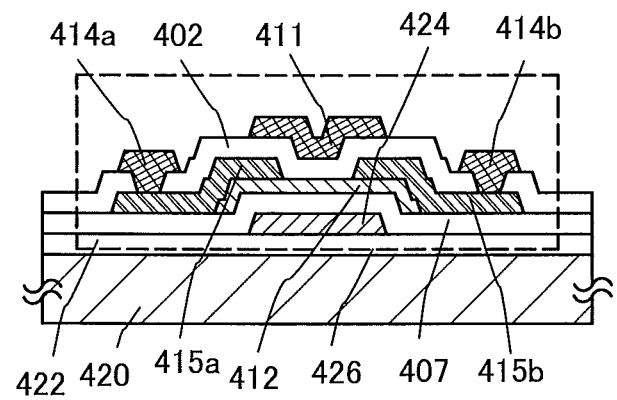

FIGS. 6A and 6B each illustrate an example of a cross-sectional structure of the transistor. Each of the transistors 425 and 426 illustrated in FIGS. 6A and 6B is a kind of transistor having a structure in which an oxide semiconductor layer is sandwiched between a conductive layer and a gate electrode layer.

In FIGS. 6A and 6B, a silicon substrate is used as a substrate, and the transistors 425 and 426 are provided over an insulating layer 422 which is formed over a substrate 420.

In FIG. 6A, a conductive layer 427 is provided between the insulating layer 422 provided over the substrate 420 and an insulating layer 407, so as to overlap with at least the entire oxide semiconductor layer 412.

FIG. 6B is an example in which a conductive layer 424 between the insulating layer 422 and the insulating layer 407 is processed as illustrated by etching and is overlapped with part of the oxide semiconductor layer 412, which includes at least the channel formation region.

As the conductive layers 427 and 424, a metal material which can withstand the temperature of heat treatment performed later may be used; an element selected from titanium (Ti), tantalum (Ta), tungsten (W), molybdenum (Mo), chromium (Cr), neodymium (Nd), and scandium (Sc), an alloy including any of the above elements as its component, an alloy film including a combination of any of these elements, a nitride including any of the above elements as its component, or the like can be used. In addition, the conductive layers 427 and 424 may each have a single-layer structure or a stacked-layer structure. For example, a single-layer structure of a tungsten layer, a stacked-layer structure including a tungsten nitride layer and a tungsten layer, or the like can be used.

The conductive layers 427 and 424 may have the same potential as or have potential different from that of a gate electrode layer 411 of the transistors 425 and 426 and can function as a second gate electrode layer. In addition, the potential of the conductive layers 427 and 424 may be fixed potential such as GND or 0 V.

The conductive layers 427 and 424 make it possible to control the electric characteristics of the transistors 425 and 426, respectively.

By applying a highly purified oxide semiconductor layer to a transistor as described above, a transistor with reduced off-state current can be provided.

This embodiment can be implemented in appropriate combination with the structures described in the other embodiments.

Embodiment 5

In this embodiment, another example of a transistor manufactured using the target described in Embodiment 1 will be described. In a transistor 390 described in this embodiment, an oxide semiconductor film formed using the sputtering target described in Embodiment 1 can be used as an active layer.

FIGS. 7A to 7E illustrate examples of cross-sectional structures of the transistor in this embodiment. The transistor 390 illustrated in FIGS. 7A to 7E is a bottom-gate transistor and is also called an inverted staggered transistor.

Although the transistor 390 is described as a single-gate transistor, the transistor 390 can be manufactured as a multigate transistor including a plurality of channel formation regions as necessary.

A process of manufacturing the transistor 390 over a substrate 394 will be described below with reference to FIGS. 7A to 7E.

First, a conductive film is formed over the substrate 394 having an insulating surface, and then a gate electrode layer 391 is formed in a first photolithography step. Edges of the formed gate electrode layer are preferably in a tapered shape, in which case the coverage with a gate insulating layer that is stacked thereover can be improved. Note that a resist mask may be formed by an inkjet method. Formation of the resist mask by an inkjet method needs no photomask, which results in a reduction in manufacturing costs.

Although there is no particular limitation on a substrate that can be used as the substrate 394 having an insulating surface, the substrate needs to have at least heat resistance high enough to withstand heat treatment performed later. A glass substrate made of barium borosilicate glass, aluminoborosilicate glass, or the like can be used as the substrate 394 having an insulating surface.

In the case where a glass substrate is used and the temperature of the heat treatment performed later is high, a glass substrate whose strain point is higher than or equal to 730° C. is preferably used. As a material of the glass substrate, a glass material such as aluminosilicate glass, aluminoborosilicate glass, or barium borosilicate glass is used, for example. Note that in general, when a glass substrate contains more barium oxide (BaO) than boron oxide, the glass substrate can be more practical and heat resistant. For that reason, a glass substrate containing BaO and $B_2O_3$ in which the amount of BaO is larger than that of $B_2O_3$ is preferably used.

Note that a substrate formed of an insulator, such as a ceramic substrate, a quartz glass substrate, a quartz substrate, or a sapphire substrate, may be used instead of the above glass substrate. Alternatively, a crystallized glass substrate or the like can be used. Further alternatively, a plastic substrate or the like can be used as appropriate.

An insulating film that serves as a base film may be provided between the substrate 394 and the gate electrode layer 391. The base film has a function of preventing diffusion of an impurity element from the substrate 394, and can be formed to have a single-layer structure or a stacked-layer structure using one or more films selected from a silicon nitride film, a silicon oxide film, a silicon nitride oxide film, and a silicon oxynitride film.

The gate electrode layer 391 can be formed to have a single-layer structure or a stacked-layer structure using a metal material such as molybdenum, titanium, chromium, tantalum, tungsten, aluminum, copper, neodymium, or scandium, or an alloy that contains any of these materials as a main component.

As a two-layer structure of the gate electrode layer 391, for example, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, and a two-layer structure in which a tungsten nitride layer and a tungsten layer are stacked. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can be formed using a light-transmitting conductive film. As an example of the light-transmitting conductive film, light-transmitting conductive oxide or the like can be given.

Next, a gate insulating layer 397 is formed over the gate electrode layer 391.

The gate insulating layer 397 can be formed to have a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. The gate insulating layer 397 is preferably formed by a sputtering method so that a large amount of hydrogen is prevented from being contained in the gate insulating layer 397. In the case of forming a silicon oxide film by a sputtering method, a silicon target or a quartz target is used as a target, and oxygen or a mixed gas of oxygen and argon is used as a sputtering gas.

The gate insulating layer 397 can have a structure in which a silicon nitride layer and a silicon oxide layer are stacked over the gate electrode layer 391 in that order. For example, a silicon nitride layer ($SiN_y$ (y>0)) with a thickness greater than or equal to 50 nm and less than or equal to 200 nm (50 nm in this embodiment) is formed as a first gate insulating layer by a sputtering method and a silicon oxide layer ($SiO_x$ (x>0)) with a thickness greater than or equal to 5 nm and less than or equal to 300 nm (50 nm in this embodiment) is stacked as a second gate insulating layer over the first gate insulating layer, whereby the gate insulating layer with a thickness of 100 nm is formed.

In order that as little hydrogen, hydroxyl, and moisture as possible are contained in the gate insulating layer 397 and an oxide semiconductor film 393 formed later, it is preferable that the substrate 394 over which the gate electrode layer 391 is formed or the substrate 394 over which the gate electrode layer 391 and the gate insulating layer 397 are formed be preheated in a preheating chamber in a sputtering apparatus as pretreatment for film formation so that impurities such as hydrogen or moisture adsorbed on the substrate 394 are eliminated and removed. The temperature of the preheating is higher than or equal to 100° C. and lower than or equal to 400° C., preferably higher than or equal to 150° C. and lower than or equal to 300° C. As an evacuation unit provided for the preheating chamber, a cryopump is preferably used. This preheating step can be omitted. This preheating may be performed in a similar manner on the substrate 394 over which layers up to and including a source electrode layer 395a and a drain electrode layer 395b are formed before formation of an oxide insulating layer 396.

Figure 7A:
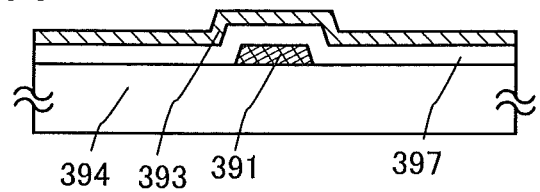
FIGS. 7A to 7E illustrate a manufacturing process of a transistor according to an embodiment.

Next, the oxide semiconductor film 393 is formed to a thickness greater than or equal to 2 nm and less than or equal to 200 nm over the gate insulating layer 397 (see FIG. 7A). The oxide semiconductor film 393 can be formed using the sputtering target described in Embodiment 1.

Note that before the oxide semiconductor film 393 is formed by a sputtering method, dust attached to a surface of the gate insulating layer 397 is preferably removed by reverse sputtering in which plasma is generated by introduction of an argon gas. The reverse sputtering is a method in which voltage is applied to a substrate side, not to a target side, using an RF power source in an argon atmosphere and plasma is generated in the vicinity of the substrate so that a substrate surface is modified. Note that a nitrogen atmosphere, a helium atmosphere, an oxygen atmosphere, or the like may be used instead of an argon atmosphere.

The oxide semiconductor film 393 is formed by a sputtering method using the sputtering target described in Embodiment 1. As the oxide semiconductor film 393, the following can be used: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Sn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 393 is formed by a sputtering method using an In—Ga—Zn—O-based oxide semiconductor target for film formation. The oxide semiconductor film 393 can be formed by a sputtering method in a rare gas (typically, argon) atmosphere, an oxygen atmosphere, or a mixed atmosphere of a rare gas (typically, argon) and oxygen. In the case of using a sputtering method, the oxide semiconductor film may be formed using a target containing $SiO_2$ at greater than or equal to 2 wt % and less than or equal to 10 wt %.

As a target for forming the oxide semiconductor film 393 by a sputtering method, an oxide semiconductor target for film formation containing zinc oxide as a main component can be used. As another example of the oxide semiconductor target for film formation, an oxide semiconductor target for film formation containing In, Ga, and Zn (the composition ratio of $In_2O_3:Ga_2O_3:ZnO=1:1:1$ (molar ratio)) can be used. As the oxide semiconductor target for film formation containing In, Ga, and Zn, a target having a composition ratio of $In_2O_3:Ga_2O_3:ZnO=1:1:2$ (molar ratio) or a target having a composition ratio of $In_2O_3:Ga_2O_3:ZnO=1:1:4$ (molar ratio) can also be used. In addition, the filling rate of the oxide semiconductor target for film formation is greater than or equal to 90% and less than or equal to 100%, preferably greater than or equal to 95% and less than or equal to 99.9%. An oxide semiconductor film which is formed using an oxide semiconductor target for film formation, which has a high filling rate, is dense.

The oxide semiconductor film 393 is formed over the substrate 394 in such a manner that the substrate is held in a treatment chamber maintained at reduced pressure and is heated to room temperature or a temperature lower than 400° C., then a sputtering gas from which hydrogen and moisture are removed is introduced while moisture remaining in the treatment chamber is removed, and a metal oxide is used as a target. In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the treatment chamber which is evacuated with the cryopump, a hydrogen atom, a compound containing a hydrogen atom such as moisture ($H_2O$), (preferably also a compound containing a carbon atom), and the like are removed, whereby the concentration of impurities in the oxide semiconductor film formed in the treatment chamber can be reduced. Sputtering film formation is performed while moisture remaining in the treatment chamber is removed using a cryopump, whereby the substrate temperature in forming the oxide semiconductor film 393 can be in the range of room temperature to a temperature lower than 400° C.

As an example of the deposition condition, the following conditions are employed: the distance between the substrate and the target is 100 mm, the pressure is 0.6 Pa, the direct-current (DC) power is 0.5 kW, and the atmosphere is an oxygen atmosphere (the proportion of oxygen flow: 100%). Note that a pulsed direct-current (DC) power source is preferably used, in which case powder substances (also referred to as particles or dust) that are formed in deposition can be reduced and the thickness can be uniform. The oxide semiconductor film preferably has a thickness greater than or equal to 5 nm and less than or equal to 30 nm. Note that the appropriate thickness differs depending on the oxide semiconductor material, and the thickness may be set as appropriate depending on the material.

Examples of a sputtering method include an RF sputtering method in which a high-frequency power source is used for a sputtering power source, a DC sputtering method in which a DC power source is used, and a pulsed DC sputtering method in which a bias is applied in a pulsed manner, and any of these methods may be used. An RF sputtering method is mainly used in the case where an insulating film is formed, and a DC sputtering method is mainly used in the case where a metal film is formed.

In addition, a multi-source sputtering apparatus in which a plurality of targets of different materials can be set may also be used. With the multi-source sputtering apparatus, films of different materials can be formed to be stacked in the same chamber, or a film of plural kinds of materials can be formed by electric discharge at the same time in the same chamber.

In addition, a sputtering apparatus provided with a magnet system inside the chamber and used for a magnetron sputtering method or a sputtering apparatus used for an ECR sputtering method in which plasma generated with the use of microwaves is used without using glow discharge may be used.

Furthermore, as a deposition method using a sputtering method, a reactive sputtering method in which a target substance and a sputtering gas component are chemically reacted with each other during deposition to form a thin compound film thereof, and a bias sputtering method in which voltage is also applied to a substrate during deposition may also be used.

Figure 7B:
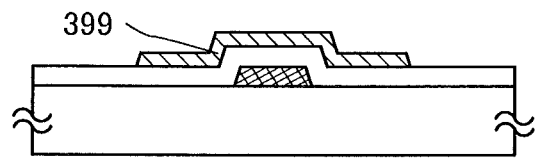

Next, in a second photolithography step, the oxide semiconductor film is processed into an island-shaped oxide semiconductor layer 399 (see FIG. 7B). Note that a resist mask for forming the island-shaped oxide semiconductor layer 399 may be formed by an inkjet method. Formation of the resist mask by an inkjet method needs no photomask, which results in a reduction in manufacturing costs.

In the case where a contact hole is formed in the gate insulating layer 397, the contact hole can be formed at the time of the formation of the oxide semiconductor layer 399.

Note that the etching of the oxide semiconductor film 393 here may be performed by dry etching, wet etching, or both wet etching and dry etching.

As an etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching conditions (the amount of electric power applied to a coil-shaped electrode, the amount of electric power applied to an electrode on a substrate side, the temperature of the electrode on the substrate side, and the like) are adjusted as appropriate.

As an etchant used for wet etching, a mixed solution of phosphoric acid, acetic acid, and nitric acid, or the like can be used. Alternatively, ITO07N (produced by KANTO CHEMICAL CO., INC.) or the like may also be used.

The etchant used in the wet etching is removed together with the etched materials by cleaning. The waste liquid containing the etchant and the material etched off may be purified and the material may be reused. A material such as indium contained in the oxide semiconductor layer is collected from the waste liquid after the etching and is reused, so that the resources can be efficiently used and the cost can be reduced.

The etching conditions (such as an etchant, etching time, and temperature) are adjusted as appropriate depending on the material so that the oxide semiconductor film can be etched into a desired shape.

Note that before formation of a conductive film in the subsequent step, reverse sputtering is preferably performed so that a resist residue or the like attached to surfaces of the oxide semiconductor layer 399 and the gate insulating layer 397 is removed.

Next, a conductive film is formed over the gate insulating layer 397 and the oxide semiconductor layer 399. The conductive film may be formed by a sputtering method or a vacuum evaporation method. As examples of the material for the conductive film, an element selected from Al, Cr, Cu, Ta, Ti, Mo, and W, an alloy containing any of the elements, an alloy film in which the elements are combined, and the like are given. Alternatively, one or more materials selected from manganese, magnesium, zirconium, beryllium, and thorium may be used. Further, the conductive film may have a single-layer structure or a stacked-layer structure of two or more layers. For example, a single-layer structure of an aluminum film containing silicon; a two-layer structure of an aluminum film and a titanium film stacked thereover; a three-layer structure of a titanium film, an aluminum film stacked thereover, and a titanium film stacked thereover; and the like can be given. Alternatively, a film, an alloy film, or a nitride film which contains aluminum (Al) and one or more elements selected from titanium (Ti), tantalum (Ta), tungsten (W), molybdenum (Mo), chromium (Cr), neodymium (Nd), and scandium (Sc) may be used.

Figure 7C:
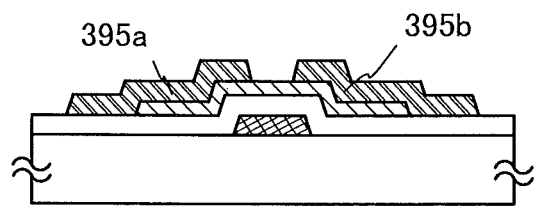

In a third photolithography step, a resist mask is formed over the conductive film and the conductive film is selectively etched, so that a source electrode layer 395a and a drain electrode layer 395b are formed, and then the resist mask is removed (see FIG. 7C).

Ultraviolet light, KrF laser light, or ArF laser light is used for light exposure for forming the resist mask in the third photolithography step. A channel length L of a transistor that is completed later is determined by a distance between bottom ends of the source electrode layer and the drain electrode layer, which are adjacent to each other over the oxide semiconductor layer 399. Note that when light exposure is performed in the case where the channel length L is less than 25 nm, light exposure for forming the resist mask in the third photolithography step is performed using extreme ultraviolet with an extremely short wavelength of several nanometers to several tens of nanometers. Light exposure using extreme ultraviolet enables high resolution and deep depth of focus. Thus, the channel length L of the transistor that is completed later can be greater than or equal to 10 nm and less than or equal to 1000 nm and the operation speed of a circuit can be increased and furthermore the value of off-state current is extremely small, so that lower power consumption can be achieved.

Note that in order to prevent the oxide semiconductor layer 399 from being removed at the time of the etching of the conductive film, materials and etching conditions of the conductive film and the oxide semiconductor layer 399 are adjusted as appropriate.

In this embodiment, a titanium film is used as the conductive film, an In—Ga—Zn—O-based oxide semiconductor is used for the oxide semiconductor layer 399, and an ammonia hydrogen peroxide solution (a mixture of ammonia, water, and a hydrogen peroxide solution) is used as an etchant for the titanium film.

Note that, in the third photolithography step, only part of the oxide semiconductor layer 399 is etched in some cases, whereby an oxide semiconductor layer having a groove (a depressed portion) is formed. In addition, the resist mask for forming the source electrode layer 395a and the drain electrode layer 395b may be formed by an ink-jet method. Formation of the resist mask by an inkjet method needs no photomask, which results in a reduction in manufacturing costs.

In order to reduce the number of photomasks and steps in the photolithography step, an etching step may be performed with the use of a multi-tone mask which is a light-exposure mask through which light is transmitted so as to have a plurality of intensities. A resist mask formed with the use of a multi-tone mask has a plurality of thicknesses and further can be changed in shape by etching; thus, the resist mask can be used in a plurality of etching steps for processing into different patterns. Thus, a resist mask corresponding to at least two kinds or more of different patterns can be formed by one multi-tone mask. Thus, the number of light-exposure masks can be reduced and the number of corresponding photolithography steps can also be reduced, whereby simplification of a process can be realized.

Plasma treatment using a gas such as $N_2O$, $N_2$, or Ar may be performed to remove water and the like attached to an exposed surface of the oxide semiconductor layer. Alternatively, plasma treatment may be performed using a mixed gas of oxygen and argon.

Figure 7D:
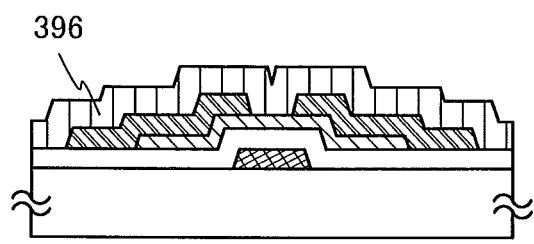

In the case where the plasma treatment is performed, the oxide insulating layer 396 is formed, without being exposed to air, as an oxide insulating layer that serves as a protective insulating film in contact with part of the oxide semiconductor layer (see FIG. 7D). In this embodiment, the oxide insulating layer 396 is formed so as to be in contact with the oxide semiconductor layer 399 in a region where the oxide semiconductor layer 399 does not overlap with the source electrode layer 395a and the drain electrode layer 395b.

In this embodiment, a silicon oxide layer containing a defect is formed as the oxide insulating layer 396 in such a manner that the substrate 394 over which layers up to and including the island-shaped oxide semiconductor layer 399, the source electrode layer 395a, and the drain electrode layer 395b are formed is heated to room temperature or a temperature lower than 100° C., a sputtering gas which contains high-purity oxygen and from which hydrogen and moisture have been removed is introduced, and a silicon target is used.

For example, the silicon oxide layer is formed with a pulsed DC sputtering method under the following conditions: the purity of a sputtering gas is 6 N (99.9999%), a boron-doped silicon target (the resistivity is 0.01 Ωcm) is used, the distance between the substrate and the target (the T-S distance) is 89 mm, the pressure is 0.4 Pa, the direct-current (DC) power is 6 kW, and the atmosphere is an oxygen atmosphere (the oxygen flow rate is 100%). The thickness of the silicon oxide layer is 300 nm. Note that as the target for forming the silicon oxide layer, quartz (preferably synthetic quartz) can be used instead of the silicon target. As the sputtering gas, oxygen or a mixed gas of oxygen and argon is used.

In that case, the oxide insulating layer 396 is preferably formed while moisture remaining in the treatment chamber is removed in order to prevent hydrogen, hydroxyl, or moisture from being contained in the oxide semiconductor layer 399 and the oxide insulating layer 396.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with the cryopump, for example, a hydrogen atom, a compound containing a hydrogen atom such as moisture ($H_2O$), and the like are removed; thus, the concentration of impurities in the oxide insulating layer 396 formed in the treatment chamber can be reduced.

Note that as the oxide insulating layer 396, a silicon oxynitride layer, an aluminum oxide layer, an aluminum oxynitride layer, or the like can be used instead of the silicon oxide layer.

Furthermore, heat treatment may be performed at 100° C. to 400° C. with the oxide insulating layer 396 and the oxide semiconductor layer 399 being in contact with each other. Since the oxide insulating layer 396 in this embodiment contains a large number of defects, with this heat treatment, impurities such as hydrogen, moisture, hydroxyl, or hydride contained in the oxide semiconductor layer 399 can be diffused into the oxide insulating layer 396, so that the impurities contained in the oxide semiconductor layer 399 are further reduced.

Figure 7E:
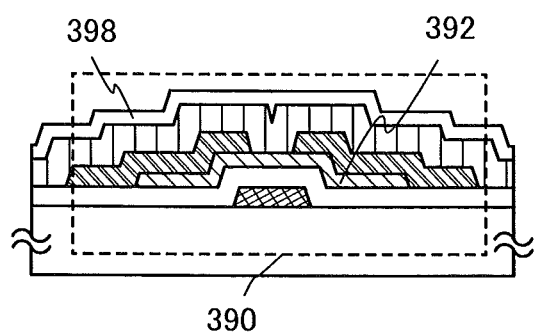

Through the above-described steps, the transistor 390 including the oxide semiconductor layer 392 in which the concentration of hydrogen, moisture, hydroxyl, or hydride is reduced can be manufactured (see FIG. 7E).

In the transistor described in this embodiment, since the oxide semiconductor film is formed using the sputtering target described in Embodiment 1, the concentration of impurities contained in the oxide semiconductor film can be reduced. Further, when moisture remaining in the reaction atmosphere is removed at the time of the formation of the oxide semiconductor film, the concentration of hydrogen and hydride in the oxide semiconductor film can be further reduced. Thus, the oxide semiconductor film can be stabilized.

A protective insulating layer may be provided over the oxide insulating layer. In this embodiment, a protective insulating layer 398 is formed over the oxide insulating layer 396. A silicon nitride film, a silicon nitride oxide film, an aluminum nitride film, an aluminum nitride oxide film, or the like is used as the protective insulating layer 398.

As the protective insulating layer 398, a silicon nitride film is formed in such a manner that the substrate 394 over which layers up to and including the oxide insulating layer 396 are formed is heated to a temperature of 100° C. to 400° C., a sputtering gas which contains high-purity nitrogen and from which hydrogen and moisture have been removed is introduced, and a silicon target is used. Also in that case, in a manner similar to that of the oxide insulating layer 396, the protective insulating layer 398 is preferably formed while moisture remaining in the treatment chamber is removed.

In the case where the protective insulating layer 398 is formed, the substrate 394 is heated to 100° C. to 400° C. at the time of the formation of the protective insulating layer 398, whereby hydrogen or moisture contained in the oxide semiconductor layer can be diffused into the oxide insulating layer. In that case, heat treatment does not have to be performed after the formation of the oxide insulating layer 396.

In the case where the silicon oxide layer is formed as the oxide insulating layer 396 and the silicon nitride layer is stacked thereover as the protective insulating layer 398, the silicon oxide layer and the silicon nitride layer can be formed in the same treatment chamber using the same silicon target. First, the silicon oxide layer is formed in such a manner that a gas containing oxygen is introduced and a silicon target provided in the treatment chamber is used. Then, the silicon nitride layer is formed in such a manner that the gas is switched to a gas containing nitrogen and the silicon target used for the silicon nitride layer is used. The silicon oxide layer and the silicon nitride layer can be formed successively without being exposed to air; thus, impurities such as hydrogen or moisture can be prevented from being adsorbed on a surface of the silicon oxide layer. In that case, heat treatment (at 100° C. to 400° C.) is preferably performed so that hydrogen or moisture contained in the oxide semiconductor layer is diffused into the oxide insulating layer, after the silicon oxide layer is formed as the oxide insulating layer 396 and the silicon nitride layer is stacked thereover as the protective insulating layer 398.

After the protective insulating layer is formed, heat treatment may be further performed at temperature higher than or equal to 100° C. and lower than or equal to 200° C. for greater than or equal to 1 hour and less than or equal to 30 hours in the air. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed under reduced pressure before the formation of the oxide insulating layer. When the heat treatment is performed under reduced pressure, the heat treatment time can be shortened. This heat treatment enables a normally-off transistor to be obtained. Thus, the reliability of a semiconductor device can be increased.

Further, moisture remaining in a reaction atmosphere is removed at the time of forming the oxide semiconductor layer that serves as a channel formation region over the gate insulating layer, whereby the concentration of hydrogen and hydride in the oxide semiconductor layer can be reduced Since the above-described steps are performed at a temperature of 400° C. or lower, the process can be applied to a manufacturing process using a glass substrate having a side longer than or equal to 1 m and a thickness less than or equal to 1 mm. In addition, since all of the above steps can be performed at a treatment temperature of 400° C. or lower, a display panel can be manufactured without consuming too much energy.

As described above, the highly purified oxide semiconductor layer is used in the transistor, whereby a transistor in which the amount of off-state current is reduced can be provided.

This embodiment can be implemented in appropriate combination with any of the structures of the other embodiments.

Embodiment 6

In this embodiment, another example of a transistor that is manufactured using the target described in Embodiment 1 will be described. In a transistor 310 described in this embodiment, an oxide semiconductor film formed using the sputtering target described in Embodiment 1 can be used as an active layer.

FIGS. 8A to 8E illustrate an example of a cross-sectional structure of the transistor in this embodiment. The transistor 310 illustrated in FIGS. 8A to 8E is a kind of bottom-gate transistor and is also called an inverted staggered transistor.

Although the transistor 310 is described as a single-gate transistor, a multi-gate transistor including a plurality of channel formation regions can be manufactured when needed.

A process of manufacturing the transistor 310 over a substrate 300 will be described below with reference to FIGS. 8A to 8E.

First, a conductive film is formed over the substrate 300 having an insulating surface, and then a gate electrode layer 311 is formed in a first photolithography step. Note that a resist mask may be formed by an inkjet method. Formation of the resist mask by an inkjet method needs no photomask, which results in a reduction in manufacturing costs.

Although there is no particular limitation on a substrate which can be used as the substrate 300 having an insulating surface, it is necessary that the substrate have at least heat resistance high enough to withstand heat treatment performed later. For example, a glass substrate made of barium borosilicate glass, aluminoborosilicate glass, or the like can be used.

In the case where the temperature of heat treatment performed later is high, a glass substrate whose strain point is higher than or equal to 730° C. is preferably used. As a glass substrate, a glass material such as aluminosilicate glass, aluminoborosilicate glass, or barium borosilicate glass is used, for example. Note that in general, in the case where a larger amount of barium oxide (BaO) than boron oxide is contained, a more practical heat-resistant glass substrate can be obtained. Therefore, a glass substrate containing a larger amount of barium oxide (BaO) than boron oxide ($B_2O_3$) is preferably used.

Note that a substrate formed of an insulator such as a ceramic substrate, a quartz substrate, or a sapphire substrate may be used instead of the above glass substrate. Alternatively, a crystallized glass substrate or the like can be used. Further alternatively, a plastic substrate or the like can be used as appropriate.

An insulating film that serves as a base film may be provided between the substrate 300 and the gate electrode layer 311. The base film has a function of preventing diffusion of an impurity element from the substrate 300, and can be formed to have a single-layer or stacked-layer structure using one or more of a silicon nitride film, a silicon oxide film, a silicon nitride oxide film, and a silicon oxynitride film.

Further, the gate electrode layer 311 can be formed to have a single-layer structure or a stacked-layer structure using a metal material such as molybdenum, titanium, chromium, tantalum, tungsten, aluminum, copper, neodymium, or scandium or an alloy material which contains any of these materials as its main component.

As a two-layer structure of the gate electrode layer 311, for example, the following structure is preferable: a structure in which a molybdenum layer is stacked over an aluminum layer, a structure in which a molybdenum layer is stacked over a copper layer, a structure in which a titanium nitride layer or a tantalum nitride layer is stacked over a copper layer, a structure in which a titanium nitride layer and a molybdenum layer are stacked, or a structure in which a tungsten nitride layer and a tungsten layer are stacked. As a three-layer structure, a structure in which a tungsten layer or a tungsten nitride layer, a layer of an alloy of aluminum and silicon or an alloy of aluminum and titanium, and a titanium nitride layer or a titanium layer are stacked is preferable.

Next, a gate insulating layer 302 is formed over the gate electrode layer 311.

The gate insulating layer 302 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer may be formed by a plasma CVD method using $SiH_4$, oxygen, and nitrogen as a deposition gas. The thickness of the gate insulating layer 302 is greater than or equal to 100 nm and less than or equal to 500 nm. In the case of a stacked-layer structure, for example, a first gate insulating layer with a thickness greater than or equal to 50 nm and less than or equal to 200 nm and a second gate insulating layer with a thickness greater than or equal to 5 nm and less than or equal to 300 nm are stacked in that order.

In this embodiment, a silicon oxynitride layer is formed to a thickness of less than or equal to 100 nm by a plasma CVD method as the gate insulating layer 302.

Next, an oxide semiconductor film 330 is formed to a thickness greater than or equal to 2 nm and less than or equal to 200 nm over the gate insulating layer 302. The oxide semiconductor film 330 is formed by a sputtering method using the sputtering target described in Embodiment 1.

Note that before the oxide semiconductor film 330 is formed by a sputtering method, dust attached to a surface of the gate insulating layer 302 is preferably removed by reverse sputtering in which plasma is generated by introduction of an argon gas. Note that a nitrogen atmosphere, a helium atmosphere, an oxygen atmosphere, or the like may be used instead of an argon atmosphere.

As the oxide semiconductor film 330, the following can be used: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Sn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 330 is formed by a sputtering method with the use of an In—Ga—Zn—O-based oxide semiconductor target for film formation. A cross-sectional view at this stage is FIG. 8A. The oxide semiconductor film 330 can be formed by a sputtering method in a rare gas (typically, argon) atmosphere, an oxygen atmosphere, or a mixed atmosphere of a rare gas (typically, argon) and oxygen. In the case of using a sputtering method, the oxide semiconductor film may be formed using a target containing $SiO_2$ at greater than or equal to 2 wt % and less than or equal to 10 wt %.

As a target for forming the oxide semiconductor film 330 by a sputtering method, an oxide semiconductor target for film formation containing zinc oxide as a main component can be used. As another example of the oxide semiconductor target for film formation, an oxide semiconductor target for film formation containing In, Ga, and Zn (the composition ratio of $In_2O_3:Ga_2O_3:ZnO=1:1:1$ (molar ratio)) or the like can be used. As the oxide semiconductor target for film formation containing In, Ga, and Zn, a target having a composition ratio of $In_2O_3:Ga_2O_3:ZnO=1:1:2$ (molar ratio) or a target having a composition ratio of $In_2O_3:Ga_2O_3:ZnO=1:1:4$ (molar ratio) can also be used. In addition, the filling rate of the oxide semiconductor target for film formation is greater than or equal to 90% and less than or equal to 100%, preferably greater than or equal to 95% and less than or equal to 99.9%. An oxide semiconductor film which is formed using an oxide semiconductor target for film formation, which has a high filling rate, is dense.

As a sputtering gas used for forming the oxide semiconductor film 330, a high-purity gas is preferably used, in which impurities such as hydrogen, moisture, hydroxyl or hydride are removed so that the concentration is approximately several parts per million or approximately several parts per billion.

The substrate is held in a treatment chamber maintained at reduced pressure and is heated to a temperature higher than or equal to 100° C. and lower than or equal to 600° C., preferably a temperature higher than or equal to 200° C. and lower than or equal to 400° C. Film formation is performed while the substrate is heated, whereby the concentration of impurities contained in the oxide semiconductor film formed can be reduced. In addition, damage due to the sputtering can be reduced. Then, a sputtering gas from which hydrogen and moisture are removed is introduced while moisture remaining in the treatment chamber is removed, and a metal oxide is used as a target. In the above manner, the oxide semiconductor film 330 is formed over the gate insulating layer 302. In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the treatment chamber which is evacuated with the cryopump, a hydrogen atom, a compound containing a hydrogen atom such as moisture ($H_2O$), (preferably also a compound containing a carbon atom), and the like are removed, whereby the concentration of impurities in the oxide semiconductor film formed in the treatment chamber can be reduced.

As an example of the deposition condition, the following conditions are employed: the distance between the substrate and the target is 100 mm, the pressure is 0.6 Pa, the direct-current (DC) power is 0.5 kW, and the atmosphere is an oxygen atmosphere (the proportion of oxygen flow: 100%). Note that a pulsed direct-current (DC) power source is preferably used, in which case powder substances (also referred to as particles or dust) that are formed in deposition can be reduced and the thickness can be uniform. The oxide semiconductor film preferably has a thickness greater than or equal to 5 nm and less than or equal to 30 nm. Note that the appropriate thickness differs depending on the oxide semiconductor material, and the thickness may be set as appropriate depending on the material.

Next, the oxide semiconductor film 330 is processed into an island-shaped oxide semiconductor layer in a second photolithography step. A resist mask for forming the island-shaped oxide semiconductor layer may be formed by an inkjet method. Formation of the resist mask by an inkjet method needs no photomask, which results in a reduction in manufacturing costs.

Next, first heat treatment is performed on the oxide semiconductor layer. Through the first heat treatment, the oxide semiconductor layer can be dehydrated or dehydrogenated. The temperature of the first heat treatment is higher than or equal to 400° C. and lower than or equal to 750° C., preferably higher than or equal to 400° C. and lower than the strain point of the substrate. Here, the substrate is put in an electric furnace that is one of heat treatment apparatuses and heat treatment is performed on the oxide semiconductor layer in a nitrogen atmosphere at 450° C. for one hour, and then moisture and hydrogen are prevented from entering the oxide semiconductor layer with the oxide semiconductor layer not exposed to air, so that the oxide semiconductor layer 331 is obtained (see FIG. 8B).

The heat treatment apparatus is not limited to an electric furnace and may be provided with a device that heats an object to be processed by thermal conduction or thermal radiation from a heater such as a resistance heater or the like. For example, an RTA (rapid thermal anneal) apparatus such as an LRTA (lamp rapid thermal anneal) apparatus or a GRTA (gas rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, such as nitrogen or a rare gas such as argon is used.

For example, as the first heat treatment, GRTA may be performed as follows: the substrate is transferred and put in an inert gas which has been heated to a temperature as high as 650° C. to 700° C., heated for several minutes, and transferred and taken out of the inert gas which has been heated to a high temperature. GRTA enables a high-temperature heat treatment in a short time.

Note that in the first heat treatment, it is preferable that moisture, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6 N (99.9999%) or higher, preferably 7 N (99.99999%) or higher (that is, the impurity concentration is 1 ppm or lower, preferably 0.1 ppm or lower).

Further, the oxide semiconductor layer might be crystallized to become a microcrystalline film or a polycrystalline film depending on the condition of the first heat treatment or the material of the oxide semiconductor layer. For example, the oxide semiconductor layer might be crystallized to become a microcrystalline oxide semiconductor film having a degree of crystallization of 90% or more, or 80% or more. Further, depending on the condition of the first heat treatment and the material of the oxide semiconductor layer, the oxide semiconductor layer might become an amorphous oxide semiconductor film containing no crystalline component. The oxide semiconductor layer may become an oxide semiconductor film in which a microcrystalline portion (with a grain diameter greater than or equal to 1 nm and greater than or less than 20 nm, typically greater than or equal to 2 nm and less than or equal to 4 nm) is mixed into an amorphous oxide semiconductor.

The first heat treatment for the oxide semiconductor layer can be performed on the oxide semiconductor film 330 that has not been processed into the island-shaped oxide semiconductor layer. In that case, the substrate is taken out of the heating apparatus after the first heat treatment, and then a photolithography step is performed.

The heat treatment which has an effect of dehydrating or dehydrogenating the oxide semiconductor layer may be performed at any of the following timings: after the oxide semiconductor layer is formed; after a source electrode and a drain electrode are stacked over the oxide semiconductor layer; and after a protective insulating film is formed over the source electrode and the drain electrode.

In the case where a contact hole is formed in the gate insulating layer 302, the formation of the contact hole may be performed before or after the dehydration or dehydrogenation of the oxide semiconductor film 330.

Note that the etching of the oxide semiconductor film may be dry etching, without limitation to wet etching.

The etching conditions (such as an etchant, etching time, and temperature) are appropriately adjusted depending on the material so that the material can be etched into a desired shape.

Next, a conductive film is formed over the gate insulating layer 302 and the oxide semiconductor layer 331. The conductive film may be formed by a sputtering method or a vacuum evaporation method. As a material of the conductive film, an element selected from Al, Cr, Cu, Ta, Ti, Mo, or W; an alloy containing any of these elements as a component; an alloy film containing any of these elements in combination; and the like can be given. Further, one or more materials selected from manganese, magnesium, zirconium, beryllium, and thorium may be used. Further, the conductive film may have a single-layer structure or a stacked-layer structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

In the case where heat treatment is performed after formation of the conductive film, the conductive film preferably has heat resistance enough to withstand the heat treatment.

Figure 8A:
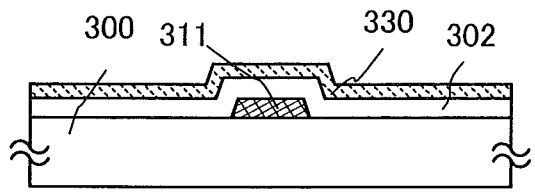
FIGS. 8A to 8E illustrate a manufacturing process of a transistor according to an embodiment.
Figure 8B:
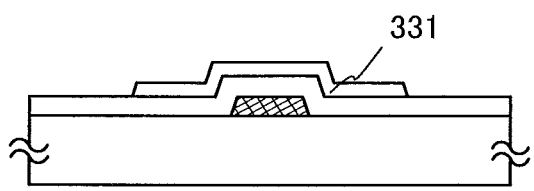
Figure 8C:
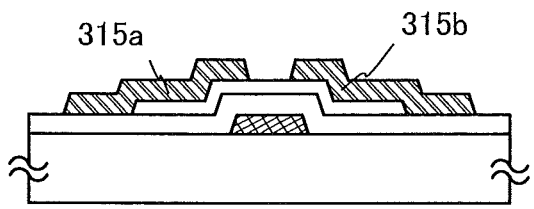
Figure 8D:
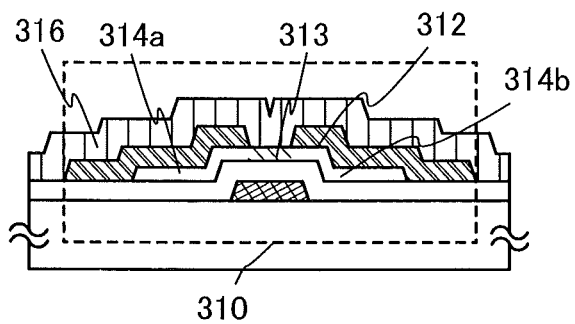
Figure 8E:
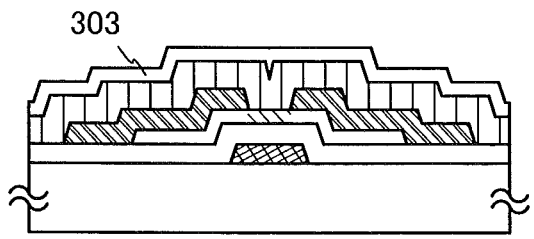
Figure 9A:
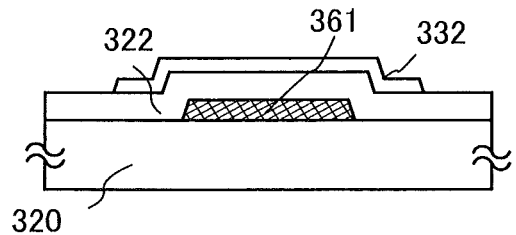
FIGS. 9A to 9D illustrate a manufacturing process of a transistor according to an embodiment.
Figure 9B:
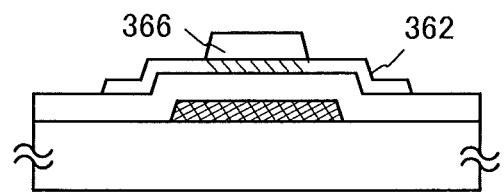
Figure 9C:
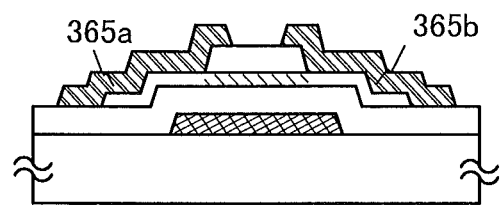
Figure 9D:
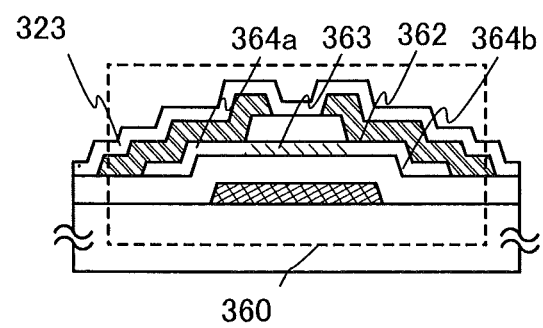

In a third photolithography step, a resist mask is formed over the conductive film and the conductive film is selectively etched, so that a source electrode layer 315a and a drain electrode layer 315b are formed, and then the resist mask is removed (see FIG. 8C).

Ultraviolet light, KrF laser light, or ArF laser light is used for light exposure for forming the resist mask in the third photolithography step. A channel length L of a transistor that is completed later is determined by a distance between bottom ends of the source electrode layer and the drain electrode layer, which are adjacent to each other over the oxide semiconductor layer 331. Note that when light exposure is performed in the case where the channel length L is less than 25 nm, light exposure for forming the resist mask in the third photolithography step is performed using extreme ultraviolet with an extremely short wavelength of several nanometers to several tens of nanometers. Light exposure using extreme ultraviolet enables high resolution and deep depth of focus. Thus, the channel length L of the transistor that is completed later can be greater than or equal to 10 nm and less than or equal to 1000 nm and the operation speed of a circuit can be increased and furthermore the value of off-state current is extremely small, so that lower power consumption can be achieved.

Note that in order to prevent the oxide semiconductor layer 331 from being removed at the time of the etching of the conductive film, materials and etching conditions of the conductive film and the oxide semiconductor layer 331 are adjusted as appropriate.

In this embodiment, a titanium film is used as the conductive film, an In—Ga—Zn—O-based oxide semiconductor is used for the oxide semiconductor layer 331, and an ammonia hydrogen peroxide solution (a mixture of ammonia, water, and a hydrogen peroxide solution) is used as an etchant for the titanium film.

Note that, in the third photolithography step, only part of the oxide semiconductor layer 331 is etched in some cases, whereby an oxide semiconductor layer having a groove (a depressed portion) is formed. In addition, the resist mask for forming the source electrode layer 315a and the drain electrode layer 315b may be formed by an ink-jet method. Formation of the resist mask by an inkjet method needs no photomask, which results in a reduction in manufacturing costs.

Further, an oxide conductive layer may be formed between the oxide semiconductor layer and the source and drain electrode layers. The oxide conductive layer and the metal layer for forming the source and drain electrode layers can be formed successively. The oxide conductive layer can function as a source region and a drain region.

The provision of the oxide conductive layer as the source and drain regions between the oxide semiconductor layer and the source and drain electrode layers makes it possible to decrease the resistance of the source and drain regions and to operate the transistor at high speed.

In order to reduce the number of photomasks and steps in the photolithography step, an etching step may be performed with the use of a multi-tone mask which is a light-exposure mask through which light is transmitted so as to have a plurality of intensities. A resist mask formed with the use of a multi-tone mask has a plurality of thicknesses and further can be changed in shape by etching; thus, the resist mask can be used in a plurality of etching steps for processing into different patterns. Thus, a resist mask corresponding to at least two kinds or more of different patterns can be formed by one multi-tone mask. Thus, the number of light-exposure masks can be reduced and the number of corresponding photolithography steps can also be reduced, whereby simplification of a process can be realized.

Next, plasma treatment using a gas such as $N_2O$, $N_2$, or Ar is performed. By this plasma treatment, water or the like attached to an exposed surface of the oxide semiconductor layer is removed. The plasma treatment may be performed using a mixed gas of oxygen and argon.

After the plasma treatment, an oxide insulating layer 316 that serves as a protective insulating film and is in contact with part of the oxide semiconductor layer is formed without exposure to air.

The oxide insulating layer 316 can be formed to a thickness of at least 1 nm by a method with which impurities such as water or hydrogen are not mixed into the oxide insulating layer 316, such as a sputtering method, as appropriate. When hydrogen is contained in the oxide insulating layer 316, entry of the hydrogen to the oxide semiconductor layer or extraction of oxygen in the oxide semiconductor layer by the hydrogen is caused, thereby causing the backchannel of the oxide semiconductor layer to have lower resistance (to be n-type), so that a parasitic channel might be formed. Therefore, it is important that a formation method in which hydrogen is not used be employed in order to form the oxide insulating layer 316 containing as little hydrogen as possible.

In this embodiment, a silicon oxide film is formed to a thickness of 200 nm as the oxide insulating layer 316 by a sputtering method. The substrate temperature in the film formation may be higher than or equal to room temperature and lower than or equal to 300° C., and is 100° C. in this embodiment. The formation of the silicon oxide film by a sputtering method can be performed in an atmosphere of a rare gas (typically, argon), an oxygen atmosphere, or an atmosphere of oxygen and a rare gas (typically, argon). As a target, a silicon oxide target or a silicon target can be used. For example, with the use of a silicon target, a silicon oxide film can be formed by a sputtering method in an atmosphere containing oxygen and nitrogen. As the oxide insulating layer 316 which is formed in contact with the oxide semiconductor layer whose resistance is reduced, an inorganic insulating film which does not contain impurities such as moisture, a hydrogen ion, and hydroxyl and blocks entry of these from the outside is used. Specifically, a silicon oxide film, a silicon oxynitride film, an aluminum oxide film, an aluminum oxynitride film, or the like is used.

In that case, the oxide insulating layer 316 is preferably formed while moisture remaining in the treatment chamber is removed so that hydrogen, hydroxyl, or moisture is prevented from being contained in the oxide semiconductor layer 331 and the oxide insulating layer 316.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with the cryopump, for example, a hydrogen atom, a compound containing a hydrogen atom such as moisture ($H_2O$), and the like are removed; thus, the concentration of impurities in the oxide insulating layer 316 formed in the treatment chamber can be reduced.

As a sputtering gas used for forming the oxide insulating layer 316, a high-purity gas is preferably used, in which impurities such as hydrogen, moisture, hydroxyl or hydride are removed so that the concentration is approximately several parts per million or approximately several parts per billion.

Next, second heat treatment (preferably at a temperature higher than or equal to 200° C. and lower than or equal to 400° C., more preferably, a temperature higher than or equal to 250° C. and lower than or equal to 350° C.) is performed in an inert gas atmosphere or an oxygen gas atmosphere. For example, the second heat treatment is performed in a nitrogen atmosphere at 250° C. for one hour. By the second heat treatment, heat is applied while part of the oxide semiconductor layer (the channel formation region) is in contact with the oxide insulating layer 316.

Through the above-described steps, the first heat treatment for dehydration or dehydrogenation of the formed oxide semiconductor film causes the oxide semiconductor film to be oxygen-deficient and to have lower resistance, that is, causes the oxide semiconductor film to be n-type (e.g., $n^−$ type). After that, by the second heat treatment in which heat is applied while the oxide insulating layer is in contact with the oxide semiconductor layer, oxygen is supplied to the oxide semiconductor layer 331 whose resistance is reduced by the first heat treatment, whereby an oxygen-deficient portion is repaired. As a result, a channel formation region 313 that overlaps with the gate electrode layer 311 has higher resistance (is i-type), and a high-resistance source region 314a that overlaps with the source electrode layer 315a and a high-resistance drain region 314b that overlaps with the drain electrode layer 315b are formed in a self-aligned manner. Through the above-described steps, the transistor 310 is manufactured (see FIG. 8D).

Further, heat treatment may be performed at a temperature higher than or equal to 100° C. and lower than or equal to 200° C. for greater than or equal to one hour and less than or equal to 30 hours in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed under reduced pressure before the formation of the oxide insulating film. When the heat treatment is performed under reduced pressure, the heat treatment time can be shortened. This heat treatment enables a normally-off transistor to be obtained. Thus, the reliability of a semiconductor device can be increased.

The high-resistance drain region 314b (or the high-resistance source region 314a) is formed in a portion of the oxide semiconductor layer which overlaps with the drain electrode layer 315b (or the source electrode layer 315a), whereby the reliability of the transistor can be increased. Specifically, the formation of the high-resistance drain region 314b enables a structure in which the conductivity can be gradually varied from the drain electrode layer 315b to the channel formation region 313 via the high-resistance drain region 314b. Thus, in the case where the transistor is operated with the drain electrode layer 315b connected to a wiring for supplying a high power supply potential VDD, the high-resistance drain region serves as a buffer and local concentration of an electric field is less likely to occur even if high voltage is applied between the gate electrode layer 311 and the drain electrode layer 315b, whereby the withstand voltage of the transistor can be increased.

The high-resistance source region or the high-resistance drain region in the oxide semiconductor layer may be formed in the entire thickness direction in the case where the oxide semiconductor layer is as thin as 15 nm or less; whereas in the case where the oxide semiconductor layer is as thick as a thickness greater than or equal to 30 nm and less than or equal to 50 nm, in part of the oxide semiconductor layer, that is, a region in the oxide semiconductor layer, which is in contact with the source electrode layer or the drain electrode layer and the vicinity thereof, the resistance may be reduced, so that the high-resistance source region or the high-resistance drain region is formed and a region of the oxide semiconductor layer, near the gate insulating layer, can be made to be i-type.

A protective insulating layer may be additionally formed over the oxide insulating layer 316. For example, a silicon nitride film is formed by an RF sputtering method. Since an RF sputtering method provides high productivity, it is preferably used as a film formation method of the protective insulating layer. As the protective insulating layer, an inorganic insulating film which does not contain impurities such as moisture, a hydrogen ion, and hydroxyl and blocks entry of these from the outside is used; for example, a silicon nitride film, an aluminum nitride film, a silicon nitride oxide film, an aluminum nitride oxide film, or the like is used. In this embodiment, as the protective insulating layer, a protective insulating layer 303 is formed using a silicon nitride film (see FIG. 8E).

In this embodiment, as the protective insulating layer 303, a silicon nitride film is formed in such a manner that the substrate 300 over which layers up to and including the oxide insulating layer 316 are formed is heated to a temperature of 100° C. to 400° C., a sputtering gas which contains high-purity nitrogen and from which hydrogen and moisture have been removed is introduced, and a silicon target is used. Also in that case, in a manner similar to that of the oxide insulating layer 316, the protective insulating layer 303 is preferably formed while moisture remaining in the treatment chamber is removed.

A planarization insulating layer for planarization may be provided over the protective insulating layer 303.

As described above, the highly purified oxide semiconductor layer is used in the transistor, whereby a transistor in which the amount of off-state current is reduced can be provided.

This embodiment can be implemented in appropriate combination with any of the structures of the other embodiments.

Embodiment 7

In this embodiment, another example of a transistor that is manufactured using the target described in Embodiment 1 will be described. In a transistor 360 described in this embodiment, an oxide semiconductor film formed using the sputtering target described in Embodiment 1 can be used as an active layer.

FIGS. 9A to 9D illustrate an example of a cross-sectional structure of the transistor in this embodiment. The transistor 360 illustrated in FIGS. 9A to 9D is a kind of bottom-gate transistor that is called a channel-protective (channel-stop) transistor and is also called an inverted staggered transistor.

Although the transistor 360 is described as a single-gate transistor, a multi-gate transistor including a plurality of channel formation regions can be manufactured when needed.

A process of manufacturing the transistor 360 over a substrate 320 will be described below with reference to FIGS. 9A to 9D.

First, a conductive film is formed over the substrate 320 having an insulating surface, and then a gate electrode layer 361 is formed in a first photolithography step. Note that a resist mask may be formed by an inkjet method. Formation of the resist mask by an inkjet method needs no photomask, which results in a reduction in manufacturing costs.

The gate electrode layer 361 can be formed to have a single-layer or stacked-layer structure using a metal material such as molybdenum, titanium, chromium, tantalum, tungsten, aluminum, copper, neodymium, or scandium, or an alloy material which contains any of these materials as a main component.

Next, a gate insulating layer 322 is formed over the gate electrode layer 361.

In this embodiment, as the gate insulating layer 322, a silicon oxynitride layer is formed to a thickness of 100 nm or less by a plasma CVD method.

Next, an oxide semiconductor film is formed to a thickness greater than or equal to 2 nm and less than or equal to 200 nm over the gate insulating layer 322, and then the oxide semiconductor film is processed into an island-shaped oxide semiconductor layer in a second photolithography step. In this embodiment, the oxide semiconductor film is formed by a sputtering method using the In—Ga—Zn—O-based oxide semiconductor target for film formation described in Embodiment 1.

In that case, the oxide semiconductor film is preferably formed while moisture remaining in a treatment chamber is removed so that hydrogen, hydroxyl, or moisture is contained as little as possible in the oxide semiconductor film.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with the cryopump, for example, a hydrogen atom, a compound containing a hydrogen atom such as moisture ($H_2O$), and the like are removed; thus, the concentration of impurities in the oxide semiconductor film formed in the treatment chamber can be reduced.

As a sputtering gas used for forming the oxide semiconductor film, a high-purity gas is preferably used, in which impurities such as hydrogen, moisture, hydroxyl or hydride are removed so that the concentration is approximately several parts per million or approximately several parts per billion.

Next, dehydration or dehydrogenation of the oxide semiconductor layer is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is put in an electric furnace that is one of heat treatment apparatuses and heat treatment is performed on the oxide semiconductor layer in a nitrogen atmosphere at 450° C. for one hour, and then moisture and hydrogen are prevented from entering the oxide semiconductor layer with the oxide semiconductor layer not exposed to air; thus, the oxide semiconductor layer 332 is obtained (see FIG. 9A).

Next, plasma treatment using a gas such as $N_2O$, $N_2$, or Ar is performed. By this plasma treatment, water or the like attached to an exposed surface of the oxide semiconductor layer is removed. The plasma treatment may be performed using a mixed gas of oxygen and argon.

Next, an oxide insulating layer is formed over the gate insulating layer 322 and the oxide semiconductor layer 332. After that, in a third photolithography step, a resist mask is formed and the oxide insulating layer is selectively etched, so that an oxide insulating layer 366 is formed. After that, the resist mask is removed.

In this embodiment, as the oxide insulating layer 366, a silicon oxide film is formed to a thickness of 200 nm by a sputtering method. The substrate temperature in the film formation may be higher than or equal to room temperature and lower than or equal to 300° C., and is 100° C. in this embodiment. The formation of the silicon oxide film with a sputtering method can be performed in an atmosphere of a rare gas (typically, argon), an oxygen atmosphere, or an atmosphere of oxygen and a rare gas (typically, argon). As a target, a silicon oxide target or a silicon target can be used. For example, with the use of a silicon target, a silicon oxide film can be formed by a sputtering method in an atmosphere containing oxygen and nitrogen. As the oxide insulating layer 366 which is formed in contact with the oxide semiconductor layer whose resistance is reduced, an inorganic insulating film which does not contain impurities such as moisture, a hydrogen ion, and hydroxyl and blocks entry of these from the outside is used. Specifically, a silicon oxide film, a silicon oxynitride film, an aluminum oxide film, an aluminum oxynitride film, or the like is used.

In that case, the oxide insulating layer 366 is preferably formed while moisture remaining in the treatment chamber is removed so that hydrogen, hydroxyl, or moisture is prevented from being contained in the oxide semiconductor layer 332 and the oxide insulating layer 366.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with the cryopump, for example, a hydrogen atom, a compound containing a hydrogen atom such as moisture ($H_2O$), and the like are removed; thus, the concentration of impurities in the oxide insulating layer 366 formed in the treatment chamber can be reduced.

As a sputtering gas used for forming the oxide insulating layer 366, a high-purity gas is preferably used, in which impurities such as hydrogen, moisture, hydroxyl or hydride are removed so that the concentration is approximately several parts per million or approximately several parts per billion.

Next, second heat treatment may be performed in an inert gas atmosphere or an oxygen gas atmosphere (preferably at a temperature higher than or equal to 200° C. and lower than or equal to 400° C., more preferably, a temperature higher than or equal to 250° C. and lower than or equal to 350° C.). For example, the second heat treatment is performed in a nitrogen atmosphere at 250° C. for one hour. By the second heat treatment, heat is applied while part of the oxide semiconductor layer (the channel formation region) is in contact with the oxide insulating layer 366

In this embodiment, the oxide semiconductor layer 332 which is provided with the oxide insulating layer 366 and is partly exposed is further subjected to heat treatment in a nitrogen atmosphere or an inert gas atmosphere or under reduced pressure. By the heat treatment in a nitrogen atmosphere or an inert gas atmosphere or under reduced pressure, the resistance of the exposed region of the oxide semiconductor layer 332, which is not covered with the oxide insulating layer 366 can be reduced. For example, the heat treatment is performed at 250° C. in a nitrogen atmosphere for one hour.

By the heat treatment performed on the oxide semiconductor layer 332 provided with the oxide insulating layer 366 in a nitrogen atmosphere, the resistance of the exposed region of the oxide semiconductor layer 332 is reduced, so that an oxide semiconductor layer 362 including regions with different resistances (indicated as a shaded region and a white region in FIG. 9B) is formed.

Next, a conductive film is formed over the gate insulating layer 322, the oxide semiconductor layer 362, and the oxide insulating layer 366. After that, in a fourth photolithography step, a resist mask is formed and the conductive film is selectively etched, so that a source electrode layer 365a and a drain electrode layer 365b are formed, and then the resist mask is removed (see FIG. 9C).

As examples of a material for the source electrode layer 365a and the drain electrode layer 365b, an element selected from Al, Cr, Cu, Ta, Ti, Mo, and W, an alloy containing any of the elements, an alloy film in which the elements are combined, and the like are given. Further, the conductive film may have a single-layer structure or a stacked-layer structure of two or more layers.

Through the above-described steps, the first heat treatment for dehydration or dehydrogenation of the formed oxide semiconductor film causes the oxide semiconductor film to be oxygen-deficient and to have lower resistance, that is, causes the oxide semiconductor film to be n-type (e.g., n⁻ type).

After that, by the second heat treatment in which heat is applied while the oxide insulating layer is in contact with the oxide semiconductor layer, oxygen is supplied to the oxide semiconductor layer 362 whose resistance is reduced by the first heat treatment, whereby an oxygen-deficient portion is repaired. As a result, a channel formation region 363 that overlaps with the gate electrode layer 361 has higher resistance (is i-type), and a high-resistance source region 364a that overlaps with the source electrode layer 365a and a high-resistance drain region 364b that overlaps with the drain electrode layer 365b are formed in a self-aligned manner. Through the above-described steps, the transistor 360 is manufactured.

Further, heat treatment may be performed at a temperature higher than or equal to 100° C. and lower than or equal to 200° C. for greater than or equal to 1 hour and less than or equal to 30 hours in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed under reduced pressure before the formation of the oxide insulating film. When the heat treatment is performed under reduced pressure, the heat treatment time can be shortened. This heat treatment enables a normally-off transistor to be obtained. Thus, the reliability of a semiconductor device can be increased.

The high-resistance drain region 364b (or the high-resistance source region 364a) is formed in a portion of the oxide semiconductor layer which overlaps with the drain electrode layer 365b (or the source electrode layer 365a), whereby the reliability of the transistor can be increased. Specifically, the formation of the high-resistance drain region 364b enables a structure in which the conductivity can be gradually varied from the drain electrode layer 365b to the channel formation region 363 via the high-resistance drain region 364b. Thus, in the case where the transistor is operated with the drain electrode layer 365b connected to a wiring for supplying a high power supply potential VDD, the high-resistance drain region serves as a buffer and local concentration of an electric field is less likely to occur even if high voltage is applied between the gate electrode layer 361 and the drain electrode layer 365b, whereby the withstand voltage of the transistor can be increased.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 9D).

Note that an oxide insulating layer may be additionally formed over the source electrode layer 365a, the drain electrode layer 365b, and the oxide insulating layer 366, and a protective insulating layer 323 may be stacked over the oxide insulating layer.

In the transistor described in this embodiment, since the oxide semiconductor film is formed using the sputtering target described in Embodiment 1, the concentration of impurities contained in the oxide semiconductor film can be reduced. When the oxide semiconductor film is formed, moisture remaining in a reaction atmosphere is removed; thus, the concentration of hydrogen and that of hydride in the oxide semiconductor film can be further reduced. Thus, the oxide semiconductor film can be stabilized.

As described above, the highly purified oxide semiconductor layer is used in the transistor, whereby a transistor in which the amount of off-state current is reduced can be provided.

This embodiment can be implemented in appropriate combination with any of the structures of the other embodiments.

Embodiment 8

In this embodiment, another example of a transistor that is manufactured using the target described in Embodiment 1 will be described. In a transistor 350 described in this embodiment, an oxide semiconductor film formed using the sputtering target described in Embodiment 1 can be used as an active layer.

FIGS. 10A to 10D illustrate an example of a cross-sectional structure of the transistor in this embodiment.

Although the transistor 350 is described as a single-gate transistor, a multi-gate transistor including a plurality of channel formation regions can be manufactured when needed.

A process of manufacturing the transistor 350 over a substrate 340 will be described below with reference to FIGS. 10A to 10D.

First, a conductive film is formed over the substrate 340 having an insulating surface, and then a gate electrode layer 351 is formed in a first photolithography step. In this embodiment, as the gate electrode layer 351, a tungsten film is formed to a thickness of 150 nm by a sputtering method.

Next, a gate insulating layer 342 is formed over the gate electrode layer 351. In this embodiment, as the gate insulating layer 342, a silicon oxynitride layer is formed to a thickness of 100 nm or less by a plasma CVD method.

Figure 10A:
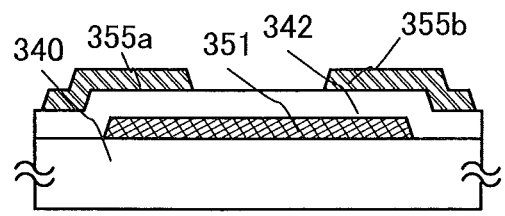
FIGS. 10A to 10D illustrate a manufacturing process of a transistor according to an embodiment.

Next, a conductive film is formed over the gate insulating layer 342, a resist mask is formed over the conductive film in a second photolithography step and the conductive film is selectively etched, so that a source electrode layer 355a and a drain electrode layer 355b are formed, and then the resist mask is removed (see FIG. 10A).

Figure 10B:
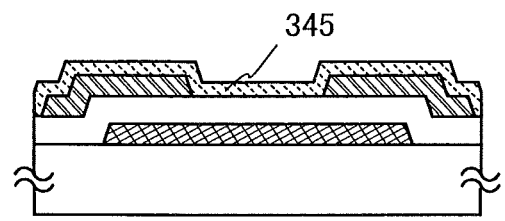

Next, an oxide semiconductor film 345 is formed (see FIG. 10B). The oxide semiconductor film 345 is formed using the sputtering target described in Embodiment 1. In this embodiment, the oxide semiconductor film 345 is formed by a sputtering method using the In—Ga—Zn—O-based oxide semiconductor target for film formation described in Embodiment 1. The oxide semiconductor film 345 is processed into an island-like oxide semiconductor layer in a third photolithography step.

In that case, the oxide semiconductor film 345 is preferably formed while moisture remaining in the treatment chamber is removed so that hydrogen, hydroxyl, or moisture is prevented from being contained in the oxide semiconductor film 345.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with the cryopump, for example, a hydrogen atom, a compound containing a hydrogen atom such as moisture ($H_2O$), and the like are removed; thus, the concentration of impurities in the oxide semiconductor film 345 formed in the treatment chamber can be reduced.

As a sputtering gas used for forming the oxide semiconductor film 345, a high-purity gas is preferably used, in which impurities such as hydrogen, moisture, hydroxyl or hydride are removed so that the concentration is approximately several parts per million or approximately several parts per billion.

Figure 10C:
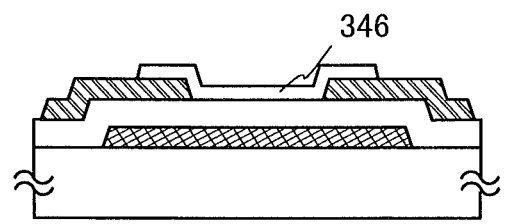
Figure 10D:
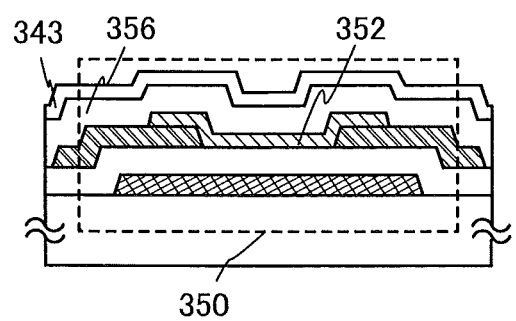

Next, dehydration or dehydrogenation of the oxide semiconductor layer is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, and heat treatment is performed on the oxide semiconductor layer in a nitrogen atmosphere at 450° C. for one hour. Then, the oxide semiconductor layer is not exposed to air so that entry of moisture and hydrogen is prevented and an oxide semiconductor layer 346 is obtained (FIG. 10C).

As the first heat treatment, GRTA may be performed as follows: the substrate is transferred and put in an inert gas which has been heated to a temperature as high as 650° C. to 700° C., heated for several minutes, and transferred and taken out of the inert gas which has been heated to a high temperature. GRTA enables a high-temperature heat treatment in a short time.

An oxide insulating layer 356 that serves as a protective insulating film is formed in contact with the oxide semiconductor layer 346.

The oxide insulating layer 356 can be formed to a thickness of at least 1 nm by a method with which impurities such as moisture or hydrogen are not mixed into the oxide insulating layer 356, such as a sputtering method, as appropriate. When hydrogen is contained in the oxide insulating layer 356, entry of the hydrogen to the oxide semiconductor layer or extraction of oxygen in the oxide semiconductor layer by the hydrogen is caused, thereby causing the backchannel of the oxide semiconductor layer to have lower resistance (to be n-type), so that a parasitic channel might be formed. For that reason, it is important that a formation method in which hydrogen is not used be employed in order to form the oxide insulating layer 356 containing as little hydrogen as possible.

In this embodiment, as the oxide insulating layer 356, a silicon oxide film is formed to a thickness of 200 nm by a sputtering method. The substrate temperature in the film formation may be higher than or equal to room temperature and lower than or equal to 300° C., and is 100° C. in this embodiment. The formation of the silicon oxide film by a sputtering method can be performed in an atmosphere of a rare gas (typically, argon), an oxygen atmosphere, or an atmosphere of oxygen and a rare gas (typically, argon). As a target, a silicon oxide target or a silicon target can be used. For example, with use of a silicon target, a silicon oxide film can be formed by a sputtering method in an atmosphere containing oxygen and nitrogen. As the oxide insulating layer 356 which is formed in contact with the oxide semiconductor layer whose resistance is reduced, an inorganic insulating film which does not contain impurities such as moisture, a hydrogen ion, and hydroxyl and blocks entry of these from the outside is used. Specifically, a silicon oxide film, a silicon oxynitride film, an aluminum oxide film, an aluminum oxynitride film, or the like is used.

In that case, the oxide insulating layer 356 is preferably formed while moisture remaining in the treatment chamber is removed so that hydrogen, hydroxyl, or moisture is prevented from being contained in the oxide semiconductor layer 346 and the oxide insulating layer 356.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with the cryopump, for example, a hydrogen atom, a compound containing a hydrogen atom such as moisture ($H_2O$), and the like are removed; thus, the concentration of impurities in the oxide insulating layer 356 formed in the treatment chamber can be reduced.

As a sputtering gas used for forming the oxide insulating layer 356, a high-purity gas is preferably used, in which impurities such as hydrogen, moisture, hydroxyl or hydride are removed so that the concentration is approximately several parts per million or approximately several parts per billion.

Next, second heat treatment is performed in an inert gas atmosphere or an oxygen gas atmosphere (preferably at a temperature higher than or equal to 200° C. and lower than or equal to 400° C., more preferably, a temperature higher than or equal to 250° C. and lower than or equal to 350° C.). For example, the second heat treatment is performed in a nitrogen atmosphere at 250° C. for one hour. By the second heat treatment, heat is applied while part of the oxide semiconductor layer (the channel formation region) is in contact with the oxide insulating layer 356.

Through the above-described steps, after the heat treatment for dehydration or dehydrogenation is performed on the formed oxide semiconductor film to reduce the resistance of the oxide semiconductor film, an oxygen-deficient portion of the oxide semiconductor film is repaired. As a result, an oxide semiconductor layer 352 whose resistance is increased (an i-type oxide semiconductor layer) is formed. Through the above-described steps, the transistor 350 is manufactured.

Further, heat treatment may be performed at a temperature higher than or equal to 100° C. and lower than or equal to 200° C. for greater than or equal to 1 hour and less than or equal to 30 hours in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed under reduced pressure before the formation of the oxide insulating film. When the heat treatment is performed under reduced pressure, the heat treatment time can be shortened. This heat treatment enables a normally-off transistor to be obtained. Thus, the reliability of a semiconductor device can be increased.

A protective insulating layer may be additionally formed over the oxide insulating layer 356. For example, a silicon nitride film is formed by an RF sputtering method. In this embodiment, as the protective insulating layer, a protective insulating layer 343 is formed using a silicon nitride film (see FIG. 10D).

A planarization insulating layer for planarization may be provided over the protective insulating layer 343.

In the transistor described in this embodiment, since the oxide semiconductor film is formed using the sputtering target described in Embodiment 1, the concentration of impurities contained in the oxide semiconductor film can be reduced. Further, when moisture remaining in a reaction atmosphere is removed at the time of the formation of the oxide semiconductor film, the concentration of hydrogen and hydride in the oxide semiconductor film can be further reduced. Thus, the oxide semiconductor film can be stabilized.

As described above, the highly purified oxide semiconductor layer is used in the transistor, whereby a transistor in which the amount of off-state current is reduced can be provided. Further, the transistor described in this embodiment, in which the amount of off-state current is reduced is used in, for example, in a pixel in a display device so that a period in which a storage capacitor provided in the pixel can hold voltage can be increased. Thus, a display device which consumes less power in displaying a still image or the like can be provided.

This embodiment can be implemented in appropriate combination with any of the structures of the other embodiments.

Embodiment 9

In this embodiment, another example of a transistor that is manufactured using the target described in Embodiment 1 will be described. In a transistor 380 described in this embodiment, an oxide semiconductor film formed using the sputtering target described in Embodiment 1 can be used as an active layer.

Figure 11:
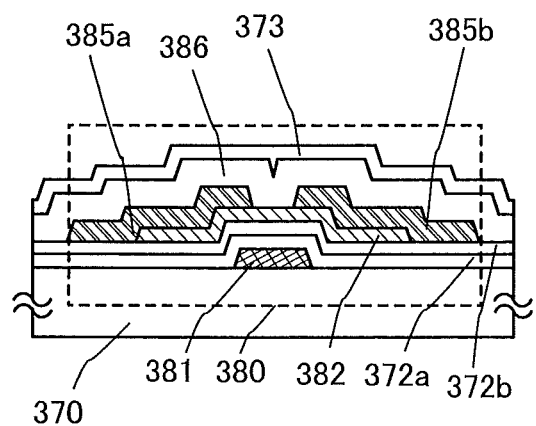
FIG. 11 is a cross-sectional view illustrating a transistor according to an embodiment.

In this embodiment, an example of a manufacturing process of a transistor, which is partly different from that of Embodiment 6, will be described with reference to FIG. 11. Since a manufacturing process of a transistor in FIG. 11 is the same as that of the transistor in FIGS. 8A to 8E except for some steps, the same reference numerals are used for the same portions, and detailed description of the same portions is not given.

In accordance with Embodiment 6, a gate electrode layer 381 is formed over a substrate 370, and a first gate insulating layer 372a and a second gate insulating layer 372b are stacked. In this embodiment, a gate insulating layer has a two-later structure, in which a nitride insulating layer is used as the first gate insulating layer 372a and an oxide insulating layer is used as the second gate insulating layer 372b.

As the oxide insulating layer, a silicon oxide layer, a silicon oxynitride layer, an aluminum oxide layer, an aluminum oxynitride layer, or the like can be used. As the nitride insulating layer, a silicon nitride layer, a silicon nitride oxide layer, an aluminum nitride layer, an aluminum nitride oxide layer, or the like can be used.

In this embodiment, the gate insulating layer has a structure in which a silicon nitride layer and a silicon oxide layer are stacked in this order over the gate electrode layer 381. A silicon nitride layer ($SiN_y$ (y>0)) with a thickness greater than or equal to 50 nm and less than or equal to 200 nm (50 nm in this embodiment) is formed as the first gate insulating layer 372a by a sputtering method, and a silicon oxide layer ($SiO_x$ (x>0)) with a thickness greater than or equal to 5 nm and less than or equal to 300 nm (100 nm in this embodiment) is stacked as the second gate insulating layer 372b over the first gate insulating layer 372a, whereby a gate insulating layer with a thickness of 150 nm is formed.

Next, an oxide semiconductor film is formed and is processed into an island-shaped oxide semiconductor layer in a photolithography step. In this embodiment, the oxide semiconductor film is formed using an In—Ga—Zn—O-based oxide semiconductor target for film formation by a sputtering method.

In that case, the oxide semiconductor film is preferably formed while moisture remaining in the treatment chamber is removed so that hydrogen, hydroxyl, or moisture is prevented from being contained in the oxide semiconductor film.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with the cryopump, for example, a hydrogen atom, a compound containing a hydrogen atom such as moisture ($H_2O$), and the like are removed; thus, the concentration of impurities in the oxide semiconductor film formed in the treatment chamber can be reduced.

As a sputtering gas used for forming the oxide semiconductor film, a high-purity gas is preferably used, in which impurities such as hydrogen, moisture, hydroxyl or hydride are removed so that the concentration is approximately several parts per million or approximately several parts per billion.

Next, dehydration or dehydrogenation of the oxide semiconductor layer is performed. The temperature of first heat treatment for dehydration or dehydrogenation is higher than or equal to 400° C. and lower than or equal to 750° C., preferably higher than or equal to 425° C. Note that in the case where the temperature is higher than or equal to 425° C., the heat treatment time may be one hour or less, whereas in the case where the temperature is lower than 425° C., the heat treatment time is longer than one hour. Here, the substrate is put in an electric furnace that is one of heat treatment apparatuses, and heat treatment is performed on the oxide semiconductor layer in a nitrogen atmosphere, and then moisture and hydrogen are prevented from entering the oxide semiconductor layer with the oxide semiconductor layer not exposed to air; thus, the oxide semiconductor layer is obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas and the $N_2O$ gas do not contain moisture, hydrogen, and the like. Alternatively, the purity of an oxygen gas or an $N_2O$ gas which is introduced into the heat treatment apparatus is preferably 6 N (99.9999%) or higher, more preferably 7 N (99.99999%) or higher (that is, the impurity concentration of the oxygen gas or the $N_2O$ gas is 1 ppm or lower, preferably 0.1 ppm or lower).

Note that a heat treatment apparatus is not limited to an electric furnace; for example, an RTA (rapid thermal anneal) apparatus such as an LRTA (lamp rapid thermal anneal) apparatus or a GRTA (gas rapid thermal anneal) apparatus can be used. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. In addition, the LRTA apparatus may be provided with not only a lamp but also a device for heating an object to be processed by heat conduction or heat radiation from a heater such as a resistance heater. GRTA refers to a method of heat treatment using a high-temperature gas. As the gas, an inert gas which does not react with an object to be processed by heat treatment, such as nitrogen or a rare gas such as argon is used. The heat treatment may be performed at 600° C. to 750° C. for several minutes by an RTA method.

Further, after the first heat treatment for dehydration or dehydrogenation, heat treatment may be performed at 200° C. to 400° C. inclusive, preferably 200° C. to 300° C. inclusive, in an atmosphere of an oxygen gas or an $N_2O$ gas.

The first heat treatment for the oxide semiconductor layer can be performed on the oxide semiconductor film that has not been processed into the island-shaped oxide semiconductor layer. In that case, the substrate is taken out of the heat apparatus after the first heat treatment, and then a photolithography step is performed.

The entire oxide semiconductor film is made to contain an excess amount of oxygen through the above-described steps, whereby the oxide semiconductor film has higher resistance, that is, the oxide semiconductor film becomes an i-type oxide semiconductor film. Thus, an oxide semiconductor layer 382 the entire region of which is an i-type region is obtained.

Next, a conductive film is formed over the second gate insulating layer 372b and the oxide semiconductor layer 382. Further, a resist mask is formed in a photolithography step over the conductive film, and selective etching is performed to form a source electrode layer 385a and a drain electrode layer 385b, and then, an oxide insulating layer 386 is formed by a sputtering method.

In that case, the oxide insulating layer 386 is preferably formed while moisture remaining in the treatment chamber is removed so that hydrogen, hydroxyl, or moisture is prevented from being contained in the oxide semiconductor layer 382 and the oxide insulating layer 386.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with the cryopump, for example, a hydrogen atom, a compound containing a hydrogen atom such as moisture ($H_2O$), and the like are removed; thus, the concentration of impurities in the oxide insulating layer 386 formed in the treatment chamber can be reduced.

As a sputtering gas used for forming the oxide insulating layer 386, a high-purity gas is preferably used, in which impurities such as hydrogen, moisture, hydroxyl or hydride are removed so that the concentration is approximately several parts per million or approximately several parts per billion.

Through the above-described steps, the transistor 380 can be manufactured.

Next, in order to reduce variation in the electric characteristics of the transistor, heat treatment (preferably at a temperature higher than or equal to 150° C. and lower than 350° C.) may be performed in an inert gas atmosphere or a nitrogen gas atmosphere. For example, the heat treatment is performed at 250° C. in a nitrogen atmosphere for one hour.

Further, heat treatment may be performed at a temperature higher than or equal to 100° C. and lower than or equal to 200° C. for greater than or equal to 1 hour and less than or equal to 30 hours. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed under reduced pressure before the formation of the oxide insulating layer. When the heat treatment is performed under reduced pressure, the heat treatment time can be shortened. This heat treatment enables a normally-off transistor to be obtained. Thus, the reliability of a semiconductor device can be increased.

A protective insulating layer 373 is formed over the oxide insulating layer 386. In this embodiment, as the protective insulating layer 373, a silicon nitride film is formed to a thickness of 100 nm by a sputtering method.

The protective insulating layer 373 and the first gate insulating layer 372a that are formed of nitride insulating layers do not contain impurities such as moisture, hydrogen, hydride, or hydroxide and have an effect of blocking entry of these impurities from the outside.

Thus, in a manufacturing process after the formation of the protective insulating layer 373, entry of impurities such as moisture from the outside can be prevented. In addition, entry of impurities such as moisture from the outside can be prevented for a long time even after a device is completed as a semiconductor device; thus, the long-term reliability of the device can be improved.

Alternatively, the insulating layers provided between the protective insulating layer 373 and the first gate insulating layer 372a that are formed of nitride insulating layers may be removed, so that the protective insulating layer 373 is in contact with the first gate insulating layer 372a.

Thus, the concentration of impurities such as moisture, hydrogen, hydride, or hydroxide in the oxide semiconductor layer is reduced to the minimum and entry of the impurities is prevented, so that the concentration of impurities in the oxide semiconductor layer can be kept low.

A planarization insulating layer for planarization may be provided over the protective insulating layer 373.

In the transistor described in this embodiment, since the oxide semiconductor film is formed using the sputtering target described in Embodiment 1, the concentration of impurities contained in the oxide semiconductor film can be reduced. Further, when moisture remaining in a reaction atmosphere is removed at the time of the formation of the oxide semiconductor film, the concentration of hydrogen and hydride in the oxide semiconductor film can be further reduced. Thus, the oxide semiconductor film can be stabilized.

As described above, the highly purified oxide semiconductor layer is used in the transistor, whereby a transistor in which the amount of off-state current is reduced can be provided. Further, the transistor in which the amount of off-state current is reduced is used in, for example, a pixel in a display device, so that a period in which a storage capacitor provided in the pixel can hold voltage can be increased. Thus, a display device which consumes less power in displaying a still image or the like can be provided.

This embodiment can be implemented in appropriate combination with any of the structures of the other embodiments.

Embodiment 10

In this embodiment, another example of a transistor that is manufactured using the target described in Embodiment 1 will be described. The transistor described in this embodiment can be used as the transistors described in Embodiments 2 to 9.

In this embodiment, an example in which a light-transmitting conductive material is used for a gate electrode layer, a source electrode layer, and a drain electrode layer will be described. Other than the above, the transistor can be manufactured in a manner similar to those of the above embodiments, and description of the same parts or parts having functions and process similar to those in the above embodiments is not given. In addition, detailed description of the same parts is omitted.

As materials for the gate electrode layer, the source electrode layer, and the drain electrode layer, a conductive material that transmits visible light can be used. For example, any of the following metal oxides can be used: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O- based metal oxide; and a Zn—O-based metal oxide. The thickness thereof is set in the range of greater than or equal to 50 nm and less than or equal to 300 nm as appropriate. As a deposition method of the metal oxide used for the gate electrode layer, the source electrode layer, and the drain electrode layer, a sputtering method, a vacuum evaporation method (an electron beam evaporation method or the like), an arc discharge ion plating method, or a spray method is used. In the case where a sputtering method is employed, deposition is preferably performed using a target containing $SiO_2$ at greater than or equal to 2 wt % and less than or equal to 10 wt %, so that $SiO_x$ (x>0) which inhibits crystallization is contained in the light-transmitting conductive film; in this way, the oxide semiconductor film can be prevented from being crystallized in heat treatment performed later.

Note that the unit of the percentage of components in the light-transmitting conductive film is atomic percent, and the percentage of components is evaluated by analysis using an electron probe X-ray microanalyzer (EPMA).

In a pixel in which the transistor is provided, when a pixel electrode layer, another electrode layer (such as a capacitor electrode layer), or a wiring layer (such as a capacitor wiring layer) is formed using a conductive film that transmits visible light, a display device having high aperture ratio can be realized. Needless to say, a gate insulating layer, an oxide insulating layer, a protective insulating layer, and a planarization insulating layer in the pixel are also preferably formed using a film that transmits visible light.

In this specification, a film that transmits visible light means a film having a thickness that allows a visible light transmittance of 75% to 100%. In the case where the film has conductivity, the film is also referred to as a transparent conductive film. Further, a conductive film which is semi-transparent to visible light may be used for a metal oxide which is used for the gate electrode layer, the source electrode layer, the drain electrode layer, the pixel electrode layer, another electrode layer, or another wiring layer. The conductive film which is semi-transparent to visible light means a film having a visible light transmittance of 50% to 75%.

When the transistor has light-transmitting properties as described above, the aperture ratio can be increased. In particular, for small liquid crystal display panels of 10 inches or smaller, high aperture ratio can be achieved even when the size of pixels is decreased in order to realize higher resolution of display images by, for example, increasing the number of gate wirings. Further, by using a light-transmitting film for components in a transistor, even when a group of high-density transistors is provided, high aperture ratio can be obtained and a sufficient area of a display region can be secured. Further, when a storage capacitor is formed using a material through a step that are the same as those of the component in the transistor, the storage capacitor can also have light-transmitting properties, which results in a further increase in the aperture ratio.

Further, the highly purified oxide semiconductor layer is used in the transistor, whereby a transistor in which the amount of off-state current is reduced can be provided. Further, the transistor in which the amount of off-state current is reduced is used in, for example, a pixel in a display device, so that a period in which a storage capacitor provided in the pixel can hold voltage can be increased. Thus, a display device which consumes less power in displaying a still image or the like can be provided.

This embodiment can be implemented in appropriate combination with any of the structures of the other embodiments.

Embodiment 11

A variety of electronic devices can be completed using a semiconductor device such as the transistors described in Embodiments 2 to 10. In a transistor manufactured using the target described in Embodiment 1, a highly purified oxide semiconductor layer is used as an active layer; thus, off-state current can be reduced. In addition, a transistor which has less variation in the threshold voltage and high reliability can be obtained. Thus, electronic devices as end products can be manufactured with high throughput and high quality.

In this embodiment, specific application examples to electronic devices are described with reference to FIGS. 16A to 16F. Note that examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large game machine such as a pinball machine, and the like. Note that the semiconductor devices according to Embodiments 2 to 10 may be integrated to be mounted on a circuit board or the like so as to be incorporated in electronic devices, or can be used as a switching element of a pixel portion. The transistor described in Embodiments 2 to 10 has a small amount of off-state current and less variation in the threshold voltage, and thus can be favorably used in both a pixel portion and a driver circuit portion.

Figure 16A:
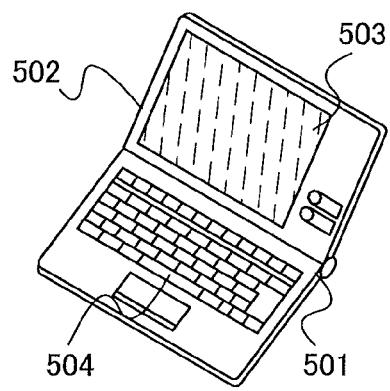
FIGS. 16A to 16F illustrate examples of electronic devices.

FIG. 16A illustrates a laptop personal computer that includes any of the semiconductor devices according to Embodiments 2 to 10 and includes a main body 501, a housing 502, a display portion 503, keyboard 504, and the like.

Figure 16D:
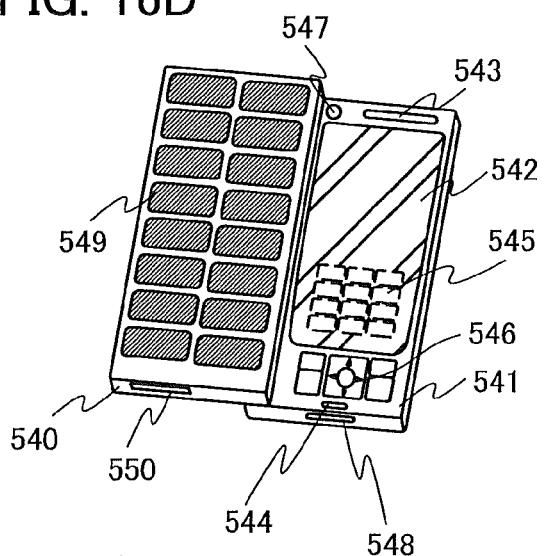
Figure 16B:
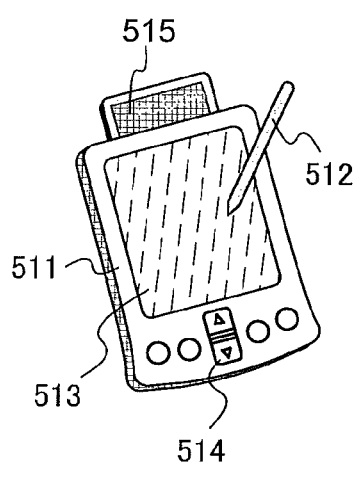

FIG. 16B is a portable information terminal (personal digital assistance (PDA)) that includes any of the semiconductor devices according to Embodiments 2 to 10. In a main body 511, a display portion 513, an external interface 515, operation buttons 514, and the like are provided. In addition, the personal information terminal includes a stylus 512 as an accessory for operation.

Figure 16E:
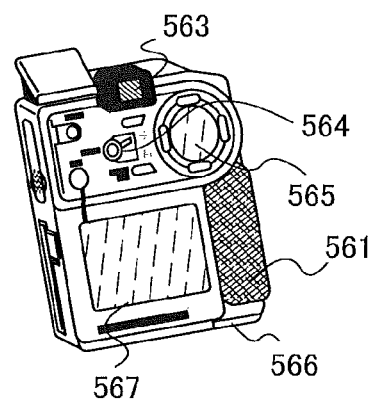
Figure 16C:
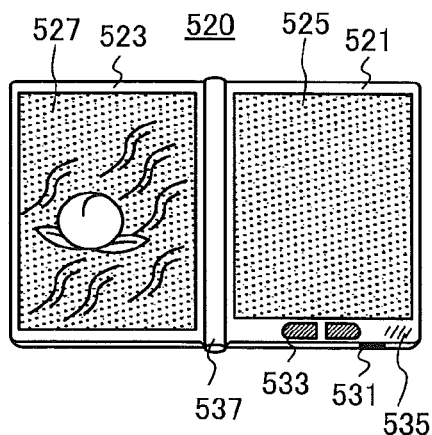

FIG. 16C illustrates an e-book reader 520 as an example of a device that includes an electronic paper in which any of the semiconductor devices according to Embodiments 2 to 10 is included. The e-book reader 520 includes two housings: a housing 521 and a housing 523. The housing 521 and the housing 523 are combined with a hinge 537 so that the e-book reader 520 can be opened and closed with the hinge 537 as an axis. Such a structure enables the e-book reader 520 to be used like a paper book.

A display portion 525 and a display portion 527 are incorporated in the housing 521 and the housing 523, respectively. The display portion 525 and the display portion 527 may display one image or different images. In the structure where different images are displayed on the display portion 525 and the display portion 527, for example, the right display portion (the display portion 525 in FIG. 16C) can display text and the left display portion (the display portion 527 in FIG. 16C) can display images.

FIG. 16C illustrates an example in which the housing 521 is provided with an operation portion and the like. For example, the housing 521 is provided with a power source 531, operation keys 533, a speaker 535, and the like. Pages can be turned with the operation keys 533. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 520 may have a function of an electronic dictionary.

Further, the e-book reader 520 may send and receive information wirelessly. Through wireless communication, desired book data or the like can be purchased and downloaded from an electronic book server.

Note that electronic paper can be used for electronic devices in all fields as long as the electronic devices display data. An electronic paper can be applied to, for example, posters, advertisement in vehicles such as trains, display in a variety of cards such as credit cards, and the like as well as e-book readers.

FIG. 16D illustrates a mobile phone that includes any of the semiconductor devices according to Embodiments 2 to 10. The mobile phone includes two housings: a housing 540 and a housing 541. The housing 541 is provided with a display panel 542, a speaker 543, a microphone 544, a pointing device 546, a camera lens 547, an external connection terminal 548, and the like. The housing 540 is provided with a solar cell 549 that charges the mobile phone, an external memory slot 550, and the like. In addition, an antenna is incorporated in the housing 541.

The display panel 542 is equipped with a touch panel function. A plurality of operation keys 545 displayed as images are indicated by dashed lines in FIG. 16D. Note that the mobile phone includes a booster circuit for increasing voltage output from the solar cell 549 to voltage needed for each circuit. In addition to the above structure, a contactless IC chip, a small memory device, and the like can be incorporated.

The display orientation of the display panel 542 changes as appropriate in accordance with the usage pattern. Further, the mobile phone is provided with the camera lens 547 on the surface on which the display panel 542 is provided, and thus it can be used as a video phone. The speaker 543 and the microphone 544 can be used for a video phone, recording, playback, and the like without being limited to verbal communication. Moreover, the housings 540 and 541 in a state where they are developed as illustrated in FIG. 16D can be slid so that one is overlapped over the other; therefore, the size of the portable information terminal can be reduced, which makes the portable information terminal suitable for being carried.

The external connection terminal 548 is connectable to an AC adaptor and a variety of cables such as a USB cable, which enables charging of the mobile phone and data communication between the mobile phone a personal computer or the like. Moreover, a larger amount of data can be stored and moved by inserting a recording medium to the external memory slot 550. Further, in addition to the above functions, an infrared communication function, a television reception function, or the like may be provided.

FIG. 16E illustrates a digital camera that includes any of the semiconductor devices according to Embodiments 2 to 10. The digital camera includes a main body 561, a display portion A 567, an eyepiece 563, an operation switch 564, a display portion B 565, a battery 566, and the like.

Figure 16F:
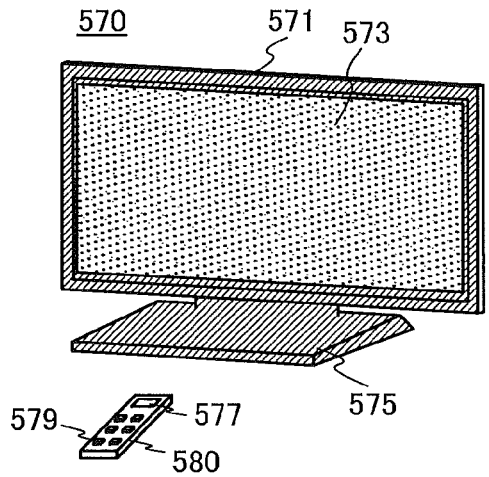

FIG. 16F illustrates a television set that includes any of the semiconductor devices according to Embodiments 2 to 10. In a television set 570, a display portion 573 is incorporated in a housing 571. Images can be displayed on the display portion 573. Here, the housing 571 is supported by a stand 575.

The television set 570 can be operated with an operation switch of the housing 571 or a separate remote controller 580. Channels and volume can be controlled with operation keys 579 of the remote controller 580 so that an image displayed on the display portion 573 can be controlled. Further, the remote controller 580 may be provided with a display portion 577 for displaying data output from the remote controller 580.

Note that the television set 570 is preferably provided with a receiver, a modem, and the like. With the receiver, a general television broadcast can be received. Moreover, when the display device is connected to a communication network with or without wires via the modem, one-way (from a sender to a receiver) or two-way (between a sender and a receiver, between receivers, or the like) information communication can be performed.

The methods, structures, and the like described in this embodiment can be combined as appropriate with any of the methods, structures, and the like described in the other embodiments.

This application is based on Japanese Patent Application serial no. 2009-260224 filed with Japan Patent Office on Nov. 13, 2009, the entire contents of which are hereby incorporated by reference.

The invention claimed is:

1. A manufacturing method of a sputtering target, comprising:
mixing and baking a plurality of metal oxides to form a sintered body;
performing a mechanical processing on the sintered body so as to form a target;
cleaning the target; and
performing a heat treatment on the cleaned target.

2. The manufacturing method according to claim 1, wherein the cleaning step is performed by an ultrasonic cleaning.

3. The manufacturing method according to claim 1, wherein a temperature of the heat treatment is 425° C. to 750° C. inclusive.

4. The manufacturing method according to claim 1, wherein the heat treatment is performed so that a concentration of hydrogen atom contained in the sintered body is lower than $1 \times 10^{16}$ atoms/cm$^3$.

5. The manufacturing method according to claim 1,
wherein the heat treatment is performed in a heat treatment apparatus into which at least one gases of nitrogen, helium, neon and argon is introduced,
wherein a purity of the at least one gases is set to be 6N or 7N or higher, and
wherein the 6N is 99.9999% and the 7N is 99.99999%.

6. The manufacturing method according to claim 1, wherein the plurality of metal oxides includes zinc oxide, gallium oxide, and indium oxide.

7. A manufacturing method of a sputtering target, comprising:
mixing and baking a plurality of metal oxides to form a sintered body;
performing a mechanical processing on the sintered body so as to form a target;
cleaning the target;
performing a heat treatment on the cleaned target; and
attaching the target to a backing plate.

8. The manufacturing method according to claim 7, wherein the cleaning step is performed by an ultrasonic cleaning.

9. The manufacturing method according to claim 7, wherein a temperature of the heat treatment is 425° C. to 750° C. inclusive.

10. The manufacturing method according to claim 7, wherein the heat treatment is performed so that a concentration of hydrogen atom contained in the sintered body is lower than $1 \times 10^{16}$ atoms/cm$^3$.

11. The manufacturing method according to claim 7,
wherein the heat treatment is performed in a heat treatment apparatus into which at least one gases of nitrogen, helium, neon and argon is introduced,
wherein a purity of the at least one gases is set to be 6N or 7N or higher, and
wherein the 6N is 99.9999% and the 7N is 99.99999%.

12. The manufacturing method according to claim 7, wherein the plurality of metal oxides includes zinc oxide, gallium oxide, and indium oxide.

13. The manufacturing method according to claim 1, wherein the filling rate of the sputtering target for film formation is 90% or higher.

14. The manufacturing method according to claim 7, wherein the filling rate of the sputtering target for film formation is 90% or higher.

15. The manufacturing method according to claim 1, wherein the heat treatment is performed so that a concentration of hydrogen atom contained in the sintered body is lower than $5 \times 10^{19}$ atoms/cm$^3$.

16. The manufacturing method according to claim 7, wherein the heat treatment is performed so that a concentration of hydrogen atom contained in the sintered body is lower than $5 \times 10^{19}$ atoms/cm$^3$.

* * * * *